United States Patent
Takita

(10) Patent No.: US 10,389,922 B2
(45) Date of Patent: Aug. 20, 2019

(54) MULTI-WAVELENGTH DETECTOR

(71) Applicant: NIKON CORPORATION, Tokyo (JP)

(72) Inventor: Mark Takita, Belmont, CA (US)

(73) Assignee: NIKON CORPORATION (JP)

(*) Notice: Subject to any disclaimer, the term of this patent is extended or adjusted under 35 U.S.C. 154(b) by 186 days.

(21) Appl. No.: 15/237,293

(22) Filed: Aug. 15, 2016

(65) Prior Publication Data

US 2017/0048429 A1 Feb. 16, 2017

Related U.S. Application Data

(60) Provisional application No. 62/205,666, filed on Aug. 15, 2015.

(51) Int. Cl.
| | |
|---|---|
| *H04N 5/225* | (2006.01) |
| *H04N 5/33* | (2006.01) |
| *H04N 9/04* | (2006.01) |
| *H04N 5/378* | (2011.01) |
| *H01L 27/146* | (2006.01) |
| *H04N 5/369* | (2011.01) |

(52) U.S. Cl.
CPC ..... *H04N 5/2253* (2013.01); *H01L 27/14647* (2013.01); *H01L 27/14652* (2013.01); *H04N 5/2254* (2013.01); *H04N 5/332* (2013.01); *H04N 5/379* (2018.08); *H04N 9/045* (2013.01)

(58) Field of Classification Search
None
See application file for complete search history.

(56) References Cited

U.S. PATENT DOCUMENTS

| | | |
|---|---|---|
| 7,742,322 B2 | 6/2010 | Sargent et al. |
| 7,746,681 B2 | 6/2010 | Sargent et al. |
| 7,773,404 B2 | 8/2010 | Sargent et al. |
| 7,881,091 B2 | 2/2011 | Sargent et al. |
| 7,923,801 B2 | 4/2011 | Tian et al. |
| 8,004,057 B2 | 8/2011 | Tian et al. |
| 8,013,412 B2 | 9/2011 | Tian |
| 8,023,306 B2 | 9/2011 | Sargent et al. |
| 8,054,671 B2 | 11/2011 | Sargent et al. |
| 8,102,693 B2 | 1/2012 | Sargent et al. |

(Continued)

OTHER PUBLICATIONS

Klekachev, et al. "Graphene-CdSe/ZnS quantum dots conjugated systems charge transfer phenomena and their applications", imec, Kapeldreef 75, B3001 Leuven, Belgium, Oct. 4, 2012.

(Continued)

*Primary Examiner* — Robert K Carpenter
(74) *Attorney, Agent, or Firm* — Roeder & Broder LLP; Steven G. Roeder

(57) ABSTRACT

A detector (10) that detects light (237) includes a sensor array (232) having a plurality of pixels (234). Each pixel (234) can include a first pixel layer (236A), and a second pixel layer (236B) stacked on top of the first pixel layer (236A). The first pixel layer (236A) can include a first, fast conductor electrode (238A) and a plurality of first quantum dots (240A) that absorb light (237) in a first range of wavelengths. The second pixel layer (236B) can include a second, fast conductor electrode (238B) and a plurality of second quantum dots (240B) that absorb light (237) in a second range of wavelengths. The second range of wavelengths is higher energy than the first range of wavelengths.

22 Claims, 7 Drawing Sheets

(56) References Cited

U.S. PATENT DOCUMENTS

| | | | |
|---|---|---|---|
| 8,115,232 | B2 | 2/2012 | Sargent et al. |
| 8,138,567 | B2 | 3/2012 | Ivanov et al. |
| 8,203,195 | B2 | 6/2012 | Ivanov et al. |
| 8,213,212 | B2 | 7/2012 | Sargent et al. |
| 8,269,260 | B2 | 9/2012 | Tian et al. |
| 8,269,302 | B2 | 9/2012 | Tian et al. |
| 8,274,126 | B2 | 9/2012 | Tian et al. |
| 8,284,586 | B2 | 10/2012 | Sargent et al. |
| 8,284,587 | B2 | 10/2012 | Sargent et al. |
| 8,415,192 | B2 | 4/2013 | Sargent et al. |
| 8,422,266 | B2 | 4/2013 | Sargent et al. |
| 8,441,090 | B2 | 5/2013 | Tian et al. |
| 8,450,138 | B2 | 5/2013 | Sargent et al. |
| 8,466,533 | B2 | 6/2013 | Tian et al. |
| 8,476,616 | B2 | 7/2013 | Sargent et al. |
| 8,476,727 | B2 | 7/2013 | Tian et al. |
| 8,482,093 | B2 | 7/2013 | Tian et al. |
| 8,513,758 | B2 | 8/2013 | Tian et al. |
| 8,525,287 | B2 | 9/2013 | Tian et al. |
| 8,530,940 | B2 | 9/2013 | Tian et al. |
| 8,530,991 | B2 | 9/2013 | Tian et al. |
| 8,530,992 | B2 | 9/2013 | Tian et al. |
| 8,530,993 | B2 | 9/2013 | Tian et al. |
| 8,546,737 | B2 | 10/2013 | Tian et al. |
| 8,546,853 | B2 | 10/2013 | Tian et al. |
| 8,558,286 | B2 | 10/2013 | Tian et al. |
| 8,643,064 | B2 | 2/2014 | Tian et al. |
| 8,724,366 | B2 | 5/2014 | Sargent et al. |
| 8,736,733 | B2 | 5/2014 | Tian et al. |
| 8,759,816 | B2 | 6/2014 | Sargent et al. |
| 8,785,908 | B2 | 7/2014 | Ivanov et al. |
| 8,803,128 | B2 | 8/2014 | Sargent et al. |
| 8,822,897 | B2 | 9/2014 | Tian et al. |
| 8,916,947 | B2 | 12/2014 | Sargent et al. |
| 9,054,246 | B2 | 11/2015 | Sargent et al. |
| 9,196,781 | B2 | 11/2015 | Tian et al. |
| 9,209,331 | B2 | 12/2015 | Ivanov et al. |
| 9,231,223 | B2 | 1/2016 | Sargent et al. |
| 9,257,582 | B2 | 2/2016 | Sargent et al. |
| 9,293,487 | B2 | 3/2016 | Tian et al. |
| 9,369,621 | B2 | 6/2016 | Malone et al. |
| 9,373,736 | B2 | 6/2016 | Sargent et al. |
| 2009/0305461 | A1* | 12/2009 | Akimoto ............ H01L 27/1225 438/104 |
| 2015/0364545 | A1* | 12/2015 | Heo ................... H01L 29/1033 257/24 |

OTHER PUBLICATIONS

Fujitsu Datasheet, IR Sensor Dual-Band Quantum Dot Infrared Photo-detector (QDIP), www.fujitsu.com/uk, Aug. 2013.

Foveon X3 Technology Direct Image Sensors, Foveon, http://www.foveon.com/article.php?a=67, Copyright 2010.

Foveon X3 Sensor from Wikipedia, Foveon, http:/en.wikipedia.org/wiki/Foveon_X3_sensor, last modified Aug. 12, 2016.

Konstantatos et al. "Hybrid graphene-quantum dot phototransistors with ultrahigh gain", Nature Nanotechnology 7, pp. 363-368, May 6, 2012.

Konstantatos, G. "Solution-Processed Quantum Dot Photodetectors", Proceedings of the IEEE, vol. 97, No. 10, Oct. 2009.

Koppens, et al. "Photodetectors based on graphene, other two-dimensional materials and hybrid systems", Nature Nanotechnology 9, pp. 780-793, Oct. 2014.

Pan, et al. "Enhanced visible and near-infrared optical absorption in silicon supersaturated with chalcogens", Applied Physics Letters 98, 121913, 2011.

Warrender, Jeffrey, "Solar & Alternative Energy, How to produce infrared optoelectronic silicon", SPIE Newsroom. DOI: 10.1117/2.1201403.005372, Mar. 13, 2014.

Konstantatos (Editor) et al., "Colloidal Quantum Dot Optoelectronics and Photovoltaics", Cambridge University Press, ISBN-13: 978-0521198264, pp. 257-291, Dec. 23, 2013.

Australian Scientists in Graphene Breakthrough, Gizmodo, Aug. 5, 2014, http://www.gizmodo.co.uk/2014/08/australian-scientists-make-graphene-breakthrough/.

Geelong to Get Country's First Graphene, Manufacturer's Monthly, Mar. 21, 2016, http://www.manmonthly.com.au/news/new-sydney-company-noncarbon-aims-to-provide-glob/.

Webpage of QuantumFilm (TM) Image sensor sold by InVisage(TM), Mar. 22, 2010, http://www.invisage.com/quantumfilm/.

Ma, "Wavelength-Versatile Graphene-Gold Film Saturable Absorber Mirror for Ultra-Broadband Mode-Locking of Bulk Lasers", Scientific Reports 4, Article No. 5016 (2014), May 23, 2014.

Figure 2: The reflectivity spectra of GG-SAM and gold-film substrate, and transmission spectrum of monolayer graphene on quaqrtz substrate, from Ma, "Wavelength-Versatile Graphene-Gold Film Saturable Absorber Mirror for Ultra-Broadband Mode-Locking of Bulk Lasers", Scientific Reports 4, Article No. 5016 (2014), May 23, 2014.

Konstantatos et al., "Colloidal Quantum Dot Optoelectronics and Photovoltaics", Cambridge University Press, ISBN-13: 978-0521198264, Chapter 7, pp. 173-198, 2013.

* cited by examiner

MULTI-WAVELENGTH DETECTOR

CROSS-REFERENCE TO RELATED APPLICATION

This application claims priority on U.S. Provisional Application Ser. No. 62/205,666 filed on Aug. 15, 2015 and entitled "MULTI-WAVELENGTH DETECTOR". As far as is permitted, the contents of U.S. Provisional Application Ser. No. 62/205,666 are incorporated herein by reference.

BACKGROUND

Detectors are often used to detect and sense various wavelengths of light. There is a never ending desire to increase the wavelength detection range and accuracy, while decreasing the size and cost of these detectors.

SUMMARY

The present invention is directed to a detector that detects light. The detector includes a sensor array having one or more pixels. In one embodiment, each pixel can include a first pixel layer, and a second pixel layer stacked on top of the first pixel layer. The first pixel layer can include a first electrode and a plurality of first quantum dots that are electrically connected to the first electrode, the first quantum dots being designed to absorb light in a first range of wavelengths. Further, the second pixel layer can include a second electrode and a plurality of second quantum dots that are electrically connected to the second electrode, the second quantum dots being designed to absorb light in a second range of wavelengths that is different from the first range of wavelengths. As provided herein, the second range of wavelengths has higher energy than the first range of wavelengths.

Each electrode can be made of a fast conductor material. As provided herein, the term "fast conductor material" shall mean any material that conducts electrons at approximately the same speed as graphene. In certain embodiments, graphene has an intrinsic mobility of around 200,000 $cm^2/Vs$. In alternative, non-exclusive embodiments, "a fast conductor material" conducts electrons at a rate that is at least 60, 70, 75, 80, 85, 90, or 95 percent of the rate at which graphene conducts electrons. Stated in another fashion, in alternative, non-exclusive embodiments, "a fast conductor material" has an intrinsic mobility of at least approximately 120,000 $cm^2/Vs$; 140,000 $cm^2/Vs$; 150000 $cm^2/Vs$; 160,000 $cm^2/Vs$; 170,000 $cm^2/Vs$; 180,000 $cm^2/Vs$; or 190,000 $cm^2/Vs$. Suitable, fast conductor materials include graphene, or graphene+chemical doping, or a material with graphene like electrical properties. Graphene enables fast bandwidths, and the ability to transport the electrons from the quantum dots to the circuit faster than normal. There are a number of new, so called "2D" structures which have been developed which are likely to achieve the same performance. In general, these other materials have similar Dirac structures to graphene.

As a result of this design, the detector is a fast, multi-wavelength sensor which is capable of simultaneously capturing a broad range of customizable wavelengths ranging from ultraviolet ("UV") to long-wavelength infrared ("LWIR"). Further, the detector has excellent performance and accuracy, and can be operated without external cooling.

In one embodiment, for each pixel, the first pixel layer converts light that is in the first range of wavelengths into a first signal, and the second pixel layer converts light that is in the second range of wavelengths into a second signal. Additionally, the detector can include a control system that receives the signals from each pixel and creates one or more images.

The first range of wavelengths and the second range of wavelengths can both be in the infrared range. Alternatively, for example, the first range of wavelengths can be in the infrared range, and the second range of wavelengths can be in the visible range.

Additionally, each pixel can include a third pixel layer that is stacked on top of the second pixel layer, the third pixel layer including silicon that absorbs light in the visible range. In this embodiment, the detector can also include a visible light filter array that is positioned on top of the third pixel layer, the visible light filter array including a visible light filter for each of the pixels of the sensor array.

In an alternative embodiment, the third pixel layer can include a third electrode and a plurality of third quantum dots that are electrically connected to the third graphene electrode, the third quantum dots being designed to absorb light in a third range of wavelengths that is different from the first range of wavelengths and the second range of wavelengths. In this embodiment, the third range of wavelengths has higher energy than the second range of wavelengths, and each of the range of wavelengths can be in the infrared range.

Moreover, each pixel can include a fourth pixel layer that is stacked on top of the third pixel layer, the fourth pixel layer including a fourth electrode and a plurality of fourth quantum dots that are electrically connected to the fourth electrode, the fourth quantum dots being designed to absorb light in a fourth range of wavelengths that is different from the first range of wavelengths, the second range of wavelengths, and the third range of wavelengths. In this embodiment, the fourth range of wavelengths has higher energy than the third range of wavelengths.

Additionally, each pixel can include a fifth pixel layer that is stacked on top of the fourth pixel layer, the fifth pixel layer including a fifth electrode and a plurality of fifth quantum dots that are electrically connected to the fifth electrode, the fifth quantum dots being designed to absorb light in a fifth range of wavelengths that is different from the first range of wavelengths, the second range of wavelengths, the third range of wavelengths, and the fourth range of wavelengths. In this embodiment, the fifth range of wavelengths has higher energy than the fourth range of wavelengths. It should be noted that each pixel can include one or more additional layers. The only limitation to the number of layers is the total attenuation of the particular wavelength through each layer.

In another embodiment, the detector includes a visible light filter array and a sensor array having a plurality of pixels. Each pixel can include a first pixel layer, and a second pixel layer stacked on top of the first pixel layer. In this embodiment, the first pixel layer includes a first electrode and a plurality of first quantum dots that are electrically connected to the first electrode, the first quantum dots being designed to absorb light in a first range of wavelengths; and the second pixel layer includes silicon that absorbs light in a second range of wavelengths that is different from the first range of wavelengths. Further, the second range of wavelengths has a higher energy than the first range of wavelengths. The visible light filter array is positioned on top of the sensor array. In this embodiment, the visible light filter array includes a separate visible light filter for each of the pixels of the sensor array. For example, the detector can be used to detect both visible light and infrared light.

In still another embodiment, the detector includes an infrared light filter array and a sensor array having a plurality of pixels. In this embodiment, each pixel includes a graphene electrode and a plurality of quantum dots that are electrically connected to the graphene electrode, the quantum dots being designed to absorb light in the infrared range. Moreover, in this embodiment, the infrared light filter array is positioned on top of the sensor array, and the infrared light filter array includes a separate infrared light filter for each of the pixels of the sensor array.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
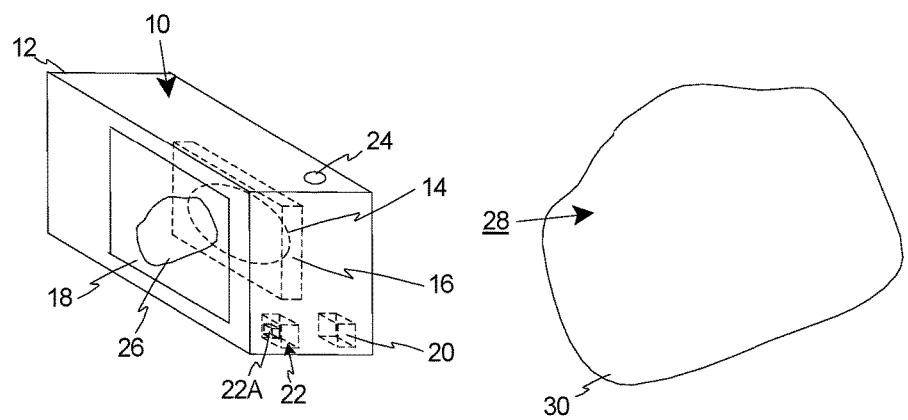
FIG. 1 is a perspective view of a first embodiment of a detector having features of the present invention.

FIG. 1 is a simplified perspective view of a detector 10 that includes an apparatus housing 12, an optical assembly 14 (illustrated in phantom), a sensor assembly 16 (illustrated in phantom), an image display 18, a storage system 20 (illustrated in phantom), a control system 22 (illustrated in phantom), and one or more control switches 24 that allow for the control and operation of the detector 10. In certain embodiments, the detector 10 can be used to capture/generate an image 26 ("frame") or a series of images (video) of an area of interest 28. As non-exclusive examples, for a video arrangement, 30, 60, or 90 frames can be captured per second. It should be noted that the detector 10 can include more or fewer components than illustrated herein. For example, the detector 10 can be designed without the optical assembly 14.

As an overview, in certain embodiments, the detector 10 is uniquely designed to cover an extensive range of wavelengths. For example, the detector 10 can be designed to detect and sense wavelengths of light ranging from ultraviolet light ("UV") to long-wavelength infrared ("LWIR"). Stated in another fashion, the detector 10 is a fast, multi-wavelength sensor which is capable of simultaneously capturing a broad range of customizable wavelengths ranging from UV to LWIR. As a result thereof, the detector 10 can be used to capture an image 26 from the area of interest 28 that includes both visible and non-visible light. For example, the control switch 24 can control the detector 10 to generate one or more images 26 that include only UV light, only visible light, only infrared light, or any combination of the UV light, the visible light, and the infrared light. Thus, the detector 10 provided herein addresses the need of a multi-wavelength sensor, which occupies a small amount of space, and is capable of simultaneously capturing visible and infrared wavelengths.

In certain embodiments, the detector 10 has excellent performance and accuracy, and can be operated without external cooling. Moreover, the detector 10 can be manufactured relatively inexpensively.

The type of area of interest 28 can vary greatly. In the simplified example of FIG. 1, the area of interest 28 includes a simplified illustration of a medical sample 30. The detector 10 receives the light from the area of interest 28 of the medical sample 30 and the medical sample 30 can be detected by the detector 10. Alternatively, as non-exclusive examples, the area of interest 28 can include other types of samples, such as powders, liquids, or solids, and/or other objects. The area of interest 28 can be illuminated by a light source (not shown) of a medical apparatus. The medical apparatus comprises the detector 10 and the light source. For example, the medical apparatus includes an endoscope, a surgical apparatus, a medical imaging apparatus, a robot and a portable apparatus.

The apparatus housing 12 can be rigid and support at least some of the other components of the detector 10. In one embodiment, the apparatus housing 12 defines a cavity that receives and/or retains the sensor assembly 16, the storage system 20, and the control system 22. Further, the optical assembly 14 can be fixedly or removably secured to the apparatus housing 12.

The optical assembly 14 can include a single lens or a combination of lenses that work in conjunction with each other to focus light onto the sensor assembly 16. The design of the optical assembly 14 can be varied so that the lenses operate at the wavelengths of interest.

The sensor assembly 16 generates/captures an array of signals (information) used to generate the image 26 or series of images. The design of the sensor assembly 16 can be varied pursuant to the teachings provided herein to detect and sense wavelengths of light ranging from ultraviolet light ("UV") to long-wavelength infrared ("LWIR"). The sensor assembly 16 is described in more detail below.

The image display 18 can display the generated image 26 or series of images. As a non-exclusive example, the image display 18 can be an LED, LCD or other type of display.

The storage system 20 (also referred to as "storage" or "memory") stores the array of signals (information) captured by the sensor assembly 16 and/or the generated image(s) 26. The electronic data storage system 20 can be fixedly or removably coupled to the housing 12. Non-exclusive examples of suitable data storage systems 20 include non-volatile memory devices and volatile memory devices.

The control system 22 is electrically connected to and controls the operation of the electrical components of the detector 10. Additionally, the control system 22 receives the array of signals from the sensor assembly 16 and generates the generated image(s) 26. The control system 22 can include one or more processors 22A (illustrated as a box in phantom) and circuits. Alternatively, for example, the control system 22 can be external to the detector 10. For example, the control system 22 can be part of a computer that receives the information from the sensor assembly 16 to generate the image(s) 26.

Figure 2A:
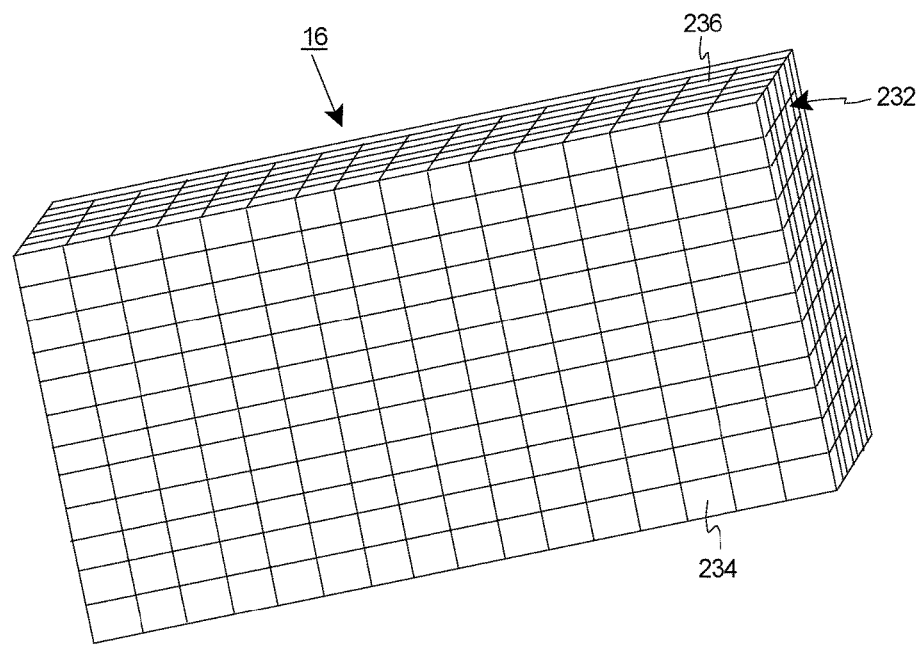
FIG. 2A is a simplified perspective view of a sensor assembly having features of the present invention.

FIG. 2A is a simplified perspective illustration of a suitable sensor assembly 16 that includes a sensor array 232 having features of the present invention. In this embodiment, the sensor array 232 includes a plurality of light-sensitive photosites 234 ("pixels") that are arranged in a rectangular array. The number of pixels 234, the design of each pixel 234, and the arrangement of the pixels 234 can be varied pursuant to the teachings provided herein. In the simplified example of FIG. 2A, the sensor array 232 includes only a twelve by sixteen, rectangular shaped array of one hundred and ninety two, pixels 234 for ease of illustration. However, the sensor array 232 can be designed to include more than or fewer than one hundred and ninety two pixels 234. As non-exclusive examples, the sensor array 232 can be designed to include 1, 2, 5, 10, 12, 24 million or more pixels.

In this embodiment, each pixel 234 has a square shape. As a non-exclusive example, each pixel 234 has a width of between 1 um and 100 um, and a length of between 1 um and 100 um. Alternatively, each pixel 234 can have a shape other than square. Further, each of the pixels 234 can be electrically isolated from other pixels 234.

As provided herein, each pixel 234 can include a plurality of stacked and adjacent pixel layers 236 that allow for the detection and sensing of wavelengths of light ranging from ultraviolet light ("UV") to long-wavelength infrared ("LWIR"). Further, for each pixel 234, the number of pixel layers 236 and the design of each pixel layer 236 can be customized to tune the sensor assembly 16 to detect and sense the desired wavelengths of interest. Stated in another fashion, the design and composition of each pixel layer 236 can be varied to sense and detect the desired wavelengths of interest for the sensor array 232. In the embodiment illustrated in FIG. 2A, each pixel 234 includes six, stacked pixel layers 236. Alternatively, for example, each pixel 234 can be designed to include more than six or fewer than six pixel layers 236. Stated in another fashion, for example, each pixel 234 can be designed to include two, three, four, five, seven, eight, nine, ten, or more pixel layers 236.

It should be noted that each pixel layer 236 can be sensitive to a different particular wavelength by adjusting the composition or each pixel layer 236. Additionally, one or more pixel layers 236 could be designed to have an extended wavelength range.

Figure 2B:
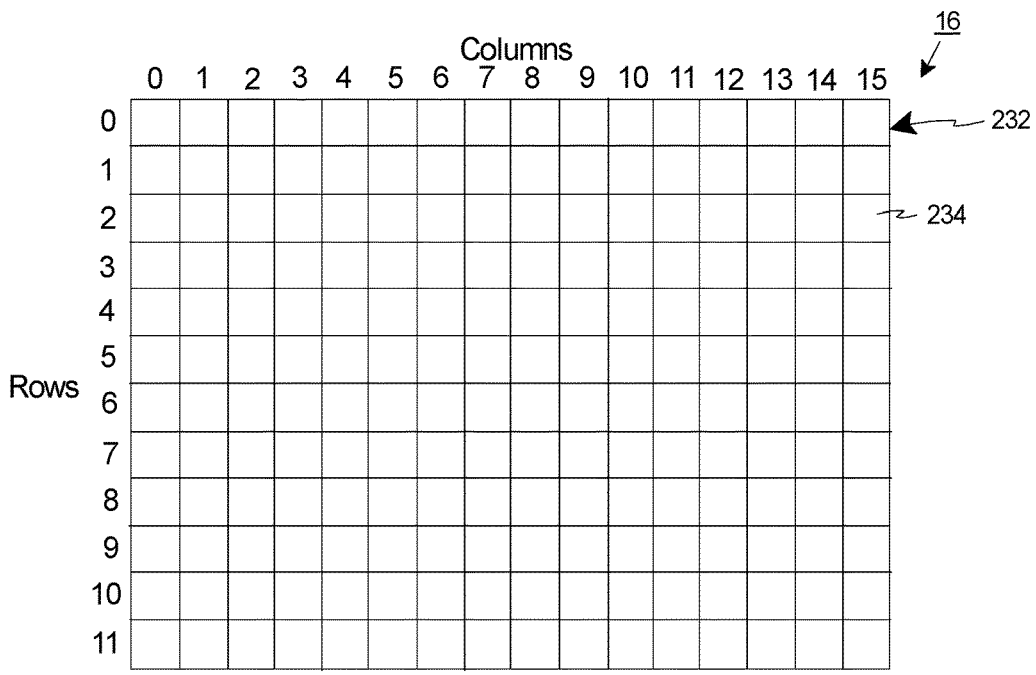
FIG. 2B is a simplified, top plan view of the sensor assembly of FIG. 2A.

FIG. 2B is a simplified top view of the sensor assembly 16 of FIG. 2A. In this Figure, the rows of sensor array 232 are labeled from 0-11 (starting at the upper left corner), and the columns of the sensor array 232 are labeled from 0-15 for ease of identifying individual pixels 234. For example, (i) the topmost, left pixel 234 can be identified as pixel row 0, column 0 (or $P_{0,0}$); (ii) the lowest, left pixel 234 can be identified as pixel row 11, column 0 (or $P_{11,0}$); and (iii) the topmost right pixel 234 can be identified as pixel row 0, column 15 (or $P_{0,15}$). In the abbreviated designation scheme, the letter "P" represents pixel, the first number in the subscript represents the row, and the second number in the subscript represents the column.

Figure 2C:
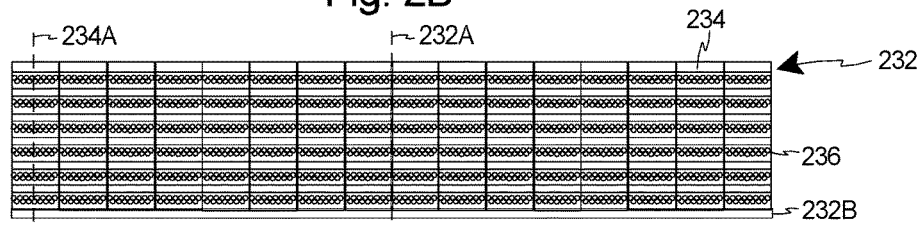
FIG. 2C is a simplified, side plan view of the sensor assembly of FIG. 2A.

FIG. 2C is a simplified side view of the sensor array 232 of FIG. 2B. In this embodiment, the sensor array 232 includes an array axis 232A, each pixel 234 includes six pixel layers 236 that are stacked along a pixel axis 234A (only one is shown) of each pixel 234. Further, in this embodiment, each pixel axis 234A is parallel to the array axis 232A.

Moreover, in this non-exclusive embodiment, the pixels 234 are stacked on top of a common array substrate 232B that supports the pixels 234. For example, the common array substrate 232B can be made of graphene coated silicon, graphene coated copper, graphene coated substrate, or any conductive material which conducts electrons with similar speed to graphene. Stated in another fashion, suitable materials include graphene or a material with graphene like electrical properties. Graphene enables fast bandwidths, and the ability to transport the electrons from the quantum dots to the circuit faster than normal. There are a number of new, so called "2D" structures which have been developed which are likely to achieve the same performance. In general, these other materials have similar Dirac structures to graphene.

Figure 2D:
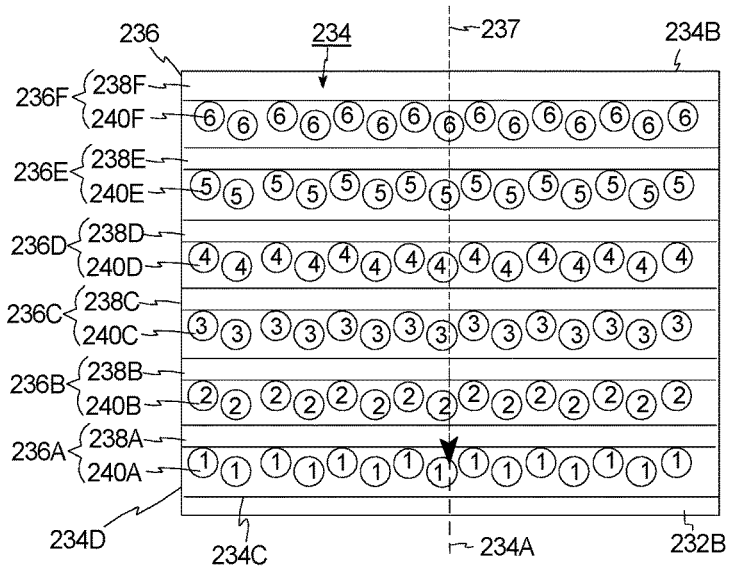
FIG. 2D is a simplified, side plan view of a pixel from the sensor assembly of FIG. 2A.

FIG. 2D is an enlarged simplified view of one, non-exclusive embodiment of one of the pixels 234 of the sensor array 232 of FIG. 2C. In this embodiment, the pixel 234 is generally rectangular shaped and includes a pixel top 234B, a pixel bottom 234C that is opposite the pixel top 234B, and four pixel sides 234D that extend between the pixel top 234B and the pixel bottom 234C. Further, in this embodiment, the pixel bottom 234C is positioned on the common array substrate 232B. It should be noted that the other pixels 234 of the sensor array 232 of FIG. 2C can have a similar design or be different in design from the pixel 234 illustrated in FIG. 2D.

In FIG. 2D, the pixel 234 includes six, rectangular shaped pixel layers 236 that are stacked on each other along the pixel axis 234A. More specifically, in this embodiment, moving from the pixel bottom 234C to the pixel top 234B, the pixel 234 includes (i) a first pixel layer 236A that is stacked on top of the array substrate 232B; (ii) a second pixel layer 236B that is stacked directly on top of the first pixel layer 236A; (iii) a third pixel layer 236C that is stacked directly on top of the second pixel layer 236B; (iv) a fourth pixel layer 236D that is stacked directly on top of the third pixel layer 236C; (v) a fifth pixel layer 236E that is stacked directly on top of the fourth pixel layer 236D; and (vi) a sixth pixel layer 236F that is stacked directly on top of the fifth pixel layer 236E. However, it should be noted that any of these layers can be referred to the "first", "second", "third", "fourth", "fifth", or "sixth" pixel layer.

In one embodiment, each pixel layer 236 provides a separate signal that relates to the amount of light 237 (illustrated as a dashed arrow) they receive from different portions of the detection spectrum. With this design, light 237 enters each pixel 234 from the pixel top 234B. In this embodiment, each pixel 234 provides six separate, simultaneous signals that can be used by the control system 22 (illustrated in FIG. 1) for generating one or more images 26 (illustrated in FIG. 1).

In one embodiment, each pixel layer 236 includes an electrode and a plurality of quantum dots that are electrically connected to that electrode. With this design, multiple layers of quantum dots are stacked and customized in order to enable simultaneous acquisition of multiple wavelengths of decreasing energy at each pixel 234. Stated in another fashion, this design allows for the simultaneously capturing of a broad range of customizable wavelengths ranging from UV to LWIR.

In FIG. 2D, (i) the first pixel layer 236A includes a first electrode 238A and a plurality of first quantum dots 240A (illustrated as circles with the number 1) that are electrically and physically connected to the first electrode 238A; (ii) the second pixel layer 236B includes a second electrode 238B and a plurality of second quantum dots 240B (illustrated as circles with the number 2) that are electrically and physically connected to the second electrode 238B; (iii) the third pixel layer 236C includes a third electrode 238C and a plurality of third quantum dots 240C (illustrated as circles with the number 3) that are electrically and physically connected to the third electrode 238C; (iv) the fourth pixel layer 236D includes a fourth electrode 238D and a plurality of fourth quantum dots 240D (illustrated as circles with the number 4) that are electrically and physically connected to the fourth electrode 238D; (v) the fifth pixel layer 236E includes a fifth electrode 238E and a plurality of fifth quantum dots 240E (illustrated as circles with the number 5) that are electrically and physically connected to the fifth electrode 238E; and (vi) the sixth pixel layer 236F includes a sixth electrode 238F and a plurality of sixth quantum dots 240F (illustrated as circles with the number 6) that are electrically and physically connected to the sixth electrode 238F.

The electrodes 238A-238F collect the electrons generated by their corresponding quantum dots 240A-240F. The design of each electrode 238A-238F can be varied to achieve the design requirements of the present invention. In one, non-exclusive embodiment, each electrode 238A-238F is made of a fast conductor material, such as a thin, "two-dimensional" graphene layer that is a honeycomb lattice made of carbon atoms. Graphene is strong, conducts electrons at high speed and efficiently, and is nearly transparent. Stated in another fashion, the utilization of graphene as an interlayer electrode 238A-238F enables very fast extraction of the electrons from the quantum dot 240A-240F structures while minimizing attenuation of light. In one non-exclusive example, each graphene electrode 238A-238F is monolayer, and has a thickness of approximately 0.235 nanometers.

For each pixel layer 236, the quantum dots 240A-240F are secured physically and electrically to the corresponding electrode 238A-238F. In one non-exclusive embodiment, for each pixel layer 236, the quantum dots 240A-240F can be suspended in a carrier fluid (not shown) that is subsequently thickened and hardened by evaporation to bond the quantum dots 240A-240F to the corresponding electrode 238A-238F. For example, the carrier fluid can include a polymer that secures and bonds the quantum dots 240A-240F to the corresponding electrode 238A-238F. In addition to evaporation, a heat curing process can be used to arrange and compact the quantum dots 240A-240F so that they are closer together. In one non-exclusive example, the heat curing can include heating to one hundred degrees Celsius for ten to twenty minutes. Electrons flow more easily when the quantum dots 240A-240F are closer together.

Moreover, the pixel layers 236 can be encapsulated to maintain integrity. Further, each of the pixel layers 236 can be epitaxially grown. Alternatively, a CVD deposition process can be used to create the pixel layers 236.

The design of each of quantum dots 240A-240F illustrated in FIG. 2D and the other embodiments can varied to achieve the desired detection requirements of the detector 10. In one embodiment, each quantum dot 240A-240F is a nanoparticle (AKA a semiconductor crystal) made of any semiconductor material such as silicon, cadmium selenide, cadmium sulfide, indium arsenide, or lead-sulfide. The quantum dots 240A-240F are highly customizable within the limitations of their physical properties. For example, due to their physical properties, the quantum dots 240A-240F can be manufactured and tuned to different wavelengths by controlling their physical size and chemistry. Stated in another fashion, the size, shape and properties of the quantum dots 240A-240F can be tuned through manufacturing to absorb wavelengths ranging from UV through visible to long wave infra-red. As a non-exclusive example, CuIn-$Se_xS_{2-x}$ made by UbiQD LLC, located in Los Alamos, N. Mex. can be utilized. Alternatively, lead sulfide (PbS) can be utilized for short wavelength infrared detection, mercury telluride (HgTe) can be utilized for long wavelength infrared detection. However, other material can be utilized.

In the embodiment illustrated in FIG. 2D and the other embodiments provided herein, one or more of the quantum dots 240A-240F can be graphene quantum dots, where the outer layer consists of a thin molecular layer of graphene. The graphene serves multiple purposes. First, the graphene outer layer helps stabilize the contained quantum dots, by limiting chemical transfer across this barrier, and reduces oxygen and moisture degradation of the quantum dots. The graphene, when properly synthesized and of molecular thickness, also assists in increasing the intra quantum dot electron transfer. As with other types of quantum dots, the inter quantum dot distance must be minimized to enable that electron mobility.

It should be noted that in many of the Figures, the shape of the quantum dots 240A-240F are illustrated as the same in each layer 236A-236F. However, the size, shape and/or properties of the quantum dots 240A-240F will be different for each the each layer 236A-236F so that each of the layers will have a different wavelength sensitivity. To illustrate this difference, (i) the first quantum dots 240A are illustrated as a circle with the number 1; (ii) the second quantum dots 240B are illustrated as a circle with the number 2; (iii) the third quantum dots 240C are illustrated as a circle with the number 3; (iv) the fourth quantum dots 240D are illustrated as a circle with the number 4; (v) the fifth quantum dots 240E are illustrated as a circle with the number 5; and (vi) the sixth quantum dots 240F are illustrated as a circle with the number 6.

In one embodiment, (i) the first quantum dots 240A are designed to absorb light in a first range of wavelengths; (ii) the second quantum dots 240B are designed to absorb light in a second range of wavelengths that is different from the first range of wavelengths; (iii) the third quantum dots 240C are designed to absorb light in a third range of wavelengths that is different from the first range of wavelengths and the second range of wavelengths; (iv) the fourth quantum dots 240D are designed to absorb light in a fourth range of wavelengths that is different from the first range of wavelengths, the second range of wavelengths, and the third range of wavelengths; (v) the fifth quantum dots 240E are designed to absorb light in a fifth range of wavelengths that is different from the first range of wavelengths, the second range of wavelengths, the third range of wavelengths, and the fourth range of wavelengths; and (vi) the sixth quantum dots 240F are designed to absorb light in a sixth range of wavelengths that is different from the first range of wavelengths, the second range of wavelengths, the third range of wavelengths, the fourth range of wavelengths, and the fifth range of wavelengths. In this embodiment, the size, shape and/or properties of each of the quantum dots 240A-240F are different, and each range of wavelengths is different.

One property of quantum dots 240A-240F is that an energy lower than the bandgap of a particular QD type will pass through that layer of quantum dots 240A-240F, while most photons having energy equal to, or greater than the band gap of the quantum dots 240A-240F will be absorbed. As provided herein, each subsequent pixel layer, moving from the sixth pixel layer 236F to the first pixel layer 236A is designed to absorb decreasing energies of photons.

More specifically, in one embodiment, moving from the pixel top 234B to the pixel bottom 234C, the quantum dots 240A-240F are designed so that each subsequent pixel layer 236 absorbs lower energy (longer wavelengths). Stated in another fashion, moving from the sixth pixel layer 236F to the first pixel layer 236A, each subsequent pixel layer 236 absorbs lower energy (longer wavelengths). More specifically, (i) the sixth quantum dots 240F are designed to absorb the highest energy (shortest wavelengths) present in the light beam 237 for the desired detection spectrum of the detector 10; (ii) the fifth quantum dots 240E are designed to absorb the second highest energy (second shortest wavelengths) present in the light beam 237 for the desired detection spectrum of the detector 10; (iii) the fourth quantum dots 240D are designed to absorb the third highest energy (third shortest wavelengths) present in the light beam 237 for the desired detection spectrum of the detector 10; (iv) the third quantum dots 240C are designed to absorb the fourth highest energy (fourth shortest wavelengths) present in the light beam 237 for the desired detection spectrum of the detector 10; (v) the second quantum dots 240B are designed to absorb the fifth highest energy (fifth shortest wavelengths) present in the light beam 237 for the desired detection spectrum of the detector 10; and (v) the first quantum dots 240A are designed to absorb the lowest energy (longest wavelengths) present in the light beam 237 for the desired detection spectrum of the detector 10.

Thus, (i) the sixth quantum dots 240F absorb light present in the light beam 237 that is in the sixth range of wavelengths ("highest energy range") and accumulates a sixth charge that is proportional to the amount of light in the highest energy range received; (ii) the fifth quantum dots 240E absorb light present in the light beam 237 that is in the fifth range of wavelengths ("second highest energy range") and accumulates a fifth charge that is proportional to the amount of light received that is in the second highest energy range; (iii) the fourth quantum dots 240D absorb light present in the light beam 237 that is in the fourth range of wavelengths ("third highest energy range") and accumulates a fourth charge that is proportional to the amount of light received in the third highest energy range; (iv) the third quantum dots 240C absorb light present in the light beam 237 that is in the third range of wavelengths ("fourth highest energy range") and accumulates a third charge that is proportional to the amount of light received in the fourth highest energy range; (v) the second quantum dots 240B absorb light present in the light beam 237 that is in the second range of wavelengths ("fifth highest energy range") and accumulates a second charge that is proportional to the amount of light received in the fifth highest energy range; and (vi) the first quantum dots 240A absorb light present in the light beam 237 that is in the first range of wavelengths ("lowest energy range") and accumulates a first charge that is proportional to the amount of light received in the lowest energy range.

In one, non-exclusive embodiment, the control system 22 measures (i) a first voltage difference ($\Delta V_1$) between the first electrode 238A and the array substrate 232B to measure the first charge and generate a first signal that relates the amount of light within the first range of wavelengths that is present in the light beam 237 at this pixel 234; (ii) a second voltage difference ($\Delta V_2$) between the second electrode 238B and the first electrode 238A to measure the second charge and generate a second signal that relates the amount of light within the second range of wavelengths that is present in the light beam 237 at this pixel 234; (iii) a third voltage difference ($\Delta V_3$) between the third electrode 238C and the second electrode 238B to measure the third charge and generate a third signal that relates the amount of light within the third range of wavelengths that is present in the light beam 237 at this pixel 234; (iv) a fourth voltage difference ($\Delta V_4$) between the fourth electrode 238D and the third electrode 238C to measure the fourth charge and generate a fourth signal that relates the amount of light within the fourth range of wavelengths that is present in the light beam 237 at this pixel 234; (v) a fifth voltage difference ($\Delta V_5$) between the fifth electrode 238E and the fourth electrode 238D to measure the fifth charge and generate a fifth signal that relates the amount of light within the fifth range of wavelengths that is present in the light beam 237 at this pixel 234; and (vi) a sixth voltage difference ($\Delta V_6$) between the sixth electrode 238F and the fifth electrode 234E to measure the sixth charge and generate a sixth signal that relates the amount of light within the sixth range of wavelengths that is present in the light beam 237 at this pixel 234.

Alternatively, or additionally, the control system 22 can measure (i) a first current between the first electrode 238A and the array substrate 232B to generate a first signal that relates the amount of light within the first range of wavelengths that is present in the light beam 237 at this pixel 234; (ii) a second current between the second electrode 238B and the first electrode 238A to generate a second signal that relates the amount of light within the second range of wavelengths that is present in the light beam 237 at this pixel 234; (iii) a third current between the third electrode 238C and the second electrode 238B to generate a third signal that relates the amount of light within the third range of wavelengths that is present in the light beam 237 at this pixel 234; (iv) a fourth current between the fourth electrode 238D and the third electrode 238C to generate a fourth signal that relates the amount of light within the fourth range of wavelengths that is present in the light beam 237 at this pixel 234; (v) a fifth current between the fifth electrode 238E and the fourth electrode 238D to generate a fifth signal that relates the amount of light within the fifth range of wavelengths that is present in the light beam 237 at this pixel 234; and (vi) a sixth current between the sixth electrode 238F and the fifth electrode 234E to generate a sixth signal that relates the amount of light within the sixth range of wavelengths that is present in the light beam 237 at this pixel 234.

In this embodiment, the control system 22 receives six separate signals for each pixel 234, and these signals can be used to generate the desired image 26 or set of images. Thus, the control system 22 receives a separate signal for each separate range of wavelengths of the detection spectrum for each pixel 234.

The size and location of each range of wavelengths can be varied to achieve the desired detection spectrum of the detector 10. As a non-exclusive example, if the desired detection spectrum is the ultraviolet light to long-wavelength infrared spectrum, (i) the sixth range of wavelengths can include ultraviolet light (10-380 nanometers); (ii) the fifth range of wavelengths can include blue visible light (380-495 nanometers); (iii) the fourth range of wavelengths can include green visible light (495-590 nanometers); (iv) the third range of wavelengths can include red visible light (590-750 nanometers); (v) the second range of wavelengths can include infrared light (750 nanometers-8 microns); (vi) the first range of wavelengths can include long wavelength infrared light (8 microns-5 microns). However, other ranges are possible depending on the bandgap energy of the quantum dots utilized. Stated in another fashion, each pixel layer 236A-236F can be sensitive to a different particular wavelength by adjusting the composition. Additionally, one or more of the pixel layers 236A-236F could be designed to have an extended wavelength range.

In another, non-exclusive example, if the desired detection spectrum of the detector 10 is the visible light to long-wavelength infrared spectrum, (i) the sixth range of wavelengths can include blue visible light (380-495 nanometers); (ii) the fifth range of wavelengths can include green visible light (495-590 nanometers); (iii) the fourth range of wavelengths can include red visible light (590-750 nanometers); (iv) the third range of wavelengths can include short-wavelength infrared light (750 nanometers-3 microns); (v) the second range of wavelengths can include mid-wavelength infrared light (3-8 microns); and (vi) the first range of wavelengths can include long wavelength infrared light (8 microns-1 millimeter).

In still another, non-exclusive example, if the desired detection spectrum of the detector 10 is the infrared spectrum, the quantum dots 240A-240F can be built so that each pixel layer 236 detects and senses a different portion of the infrared spectrum of 750 nanometers to 1 millimeter spectrum.

In yet another, non-exclusive example, if the desired detection spectrum of the detector 10 is only a portion of the infrared spectrum, the quantum dots 240A-240F can be built so that each pixel layer 236 detects and senses a different portion of the desired spectrum.

Figure 3A:
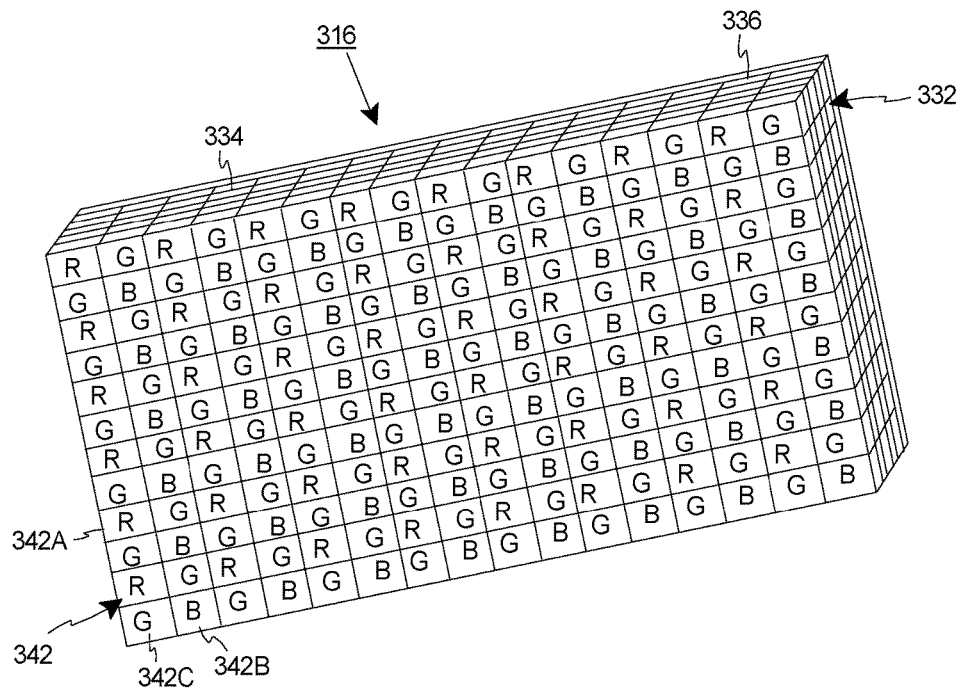
FIG. 3A is a simplified perspective view of another embodiment of a sensor assembly having features of the present invention.

FIG. 3A is a simplified perspective illustration of another embodiment of a sensor assembly 316 having features of the present invention. In this embodiment, the sensor assembly 316 includes a sensor array 332 and a visible light filter array 342 positioned on top of the sensor array 332. In this embodiment, the sensor array 332 includes a plurality of light-sensitive photosites 334 ("pixels") that are arranged in a rectangular array. The number of pixels 334, the design of each pixel 334, and the arrangement of the pixels 334 can be varied pursuant to the teachings provided herein. In the simplified example of FIG. 3A, the sensor array 332 and the visible light filter array 342 includes only a twelve by sixteen, rectangular shaped array of one hundred and ninety two, pixels 334 for ease of illustration.

In this embodiment, each pixel 334 can include a plurality of stacked and adjacent pixel layers 336 that allow for the detection and sensing of wavelengths of light ranging from visible light to long-wavelength infrared ("LWIR"). Further, for each pixel 334, the number of pixel layers 336 and the design of each pixel layer 336 can be customized to tune the sensor assembly 316 to detect and sense the desired wavelengths of interest. Stated in another fashion, the design and composition of each pixel layer 336 can be varied to sense and detect the desired wavelengths of interest for the sensor array 332. In the embodiment illustrated in FIG. 3A, each pixel 334 includes four, stacked pixel layers 336. Alternatively, for example, each pixel 334 can be designed to include more than four or fewer than four pixel layers 336.

In one embodiment, the visible light filter array 342 includes (i) a plurality of first, visible light passband filters 342A ("R") that transmit light in a first visible light passband and the infrared range, and blocks light in the visible spectrum that is outside the first visible light passband; (ii) a plurality of second, visible light passband filters 342B that transmit light in a second visible light passband and the infrared range, and blocks light in the visible spectrum that is outside the second visible light passband; and (iii) a plurality of third visible light passband filters 342C that transmit light in a third visible light passband and the infrared range, and blocks light in the visible spectrum that is outside the third passband. In one non-exclusive embodiment, (i) the first visible light passband filter 342A is a red (denoted with a "R") filter that transmits red light and infrared light, and blocks visible light that is not red; (ii) the second visible light passband filter 342B is a blue (denoted with a "B") filter that transmits blue light and infrared light, and blocks visible light that is not blue; and (iii) the third passband filter 342C is a green filter (denoted with a "G") that transmits green light and infrared light, and blocks light that is not green. With this design, each visible light filter 342A, 342B, 342C bandpasses (transmits) only one of the visible colors (e.g. either red, green, or blue), blocks the other two of the visible colors, and transmits light outside of the visible range (e.g. transmits light in the infrared range).

A common pattern for the visible filter array 342 is a Bayer filter pattern that includes fifty percent green filters 342C, twenty-five percent red filters 342A, and twenty-five percent blue filters 342B to mimic the physiology of the human eye. In the embodiment illustrated in FIG. 3A, the Bayer filter array 342 alternates a row of red and green filters 342A, 342C with a row of green and blue filters 342C, 342B. Alternatively, the filters 342A, 342B, 342C can have another arrangement.

Alternatively, the visible light passband filters 342A, 342B, 342C can be arranged in another fashion, e.g. evenly distributed. Further, the visible light filter array 342 can include more than three or fewer than three visible light passband filters 342A, 342B, 342C.

Figure 3B:
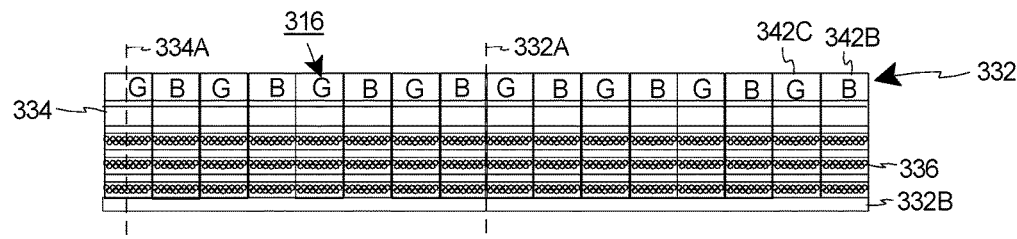
FIG. 3B is a simplified, side plan view of the sensor assembly of FIG. 3A.

FIG. 3B is a simplified side view of the sensor assembly 316 including the sensor array 332 and the visible light filter array 342 of FIG. 3A. In this embodiment, the sensor array 332 includes the array axis 332A, and each pixel 334 includes four pixel layers 336 that are stacked along a pixel axis 334A (only one is shown) of each pixel 334. Moreover, in this non-exclusive embodiment, the pixels 334 are again stacked on top of the common array substrate 332B that supports the pixels 334.

It should be noted that the visible light filter array 342 is stacked on top of the sensor array 332. Further, as provided above, the visible light filter array 342 includes a separate filter 342A (illustrated in FIG. 3A), 342B, 342C for each pixel 334. Thus, in this embodiment, each pixel 334 includes four pixel layers 336, and one visible passband filter 342A, 342B, 342C stacked on top of the pixel layers 336.

Figure 3C:
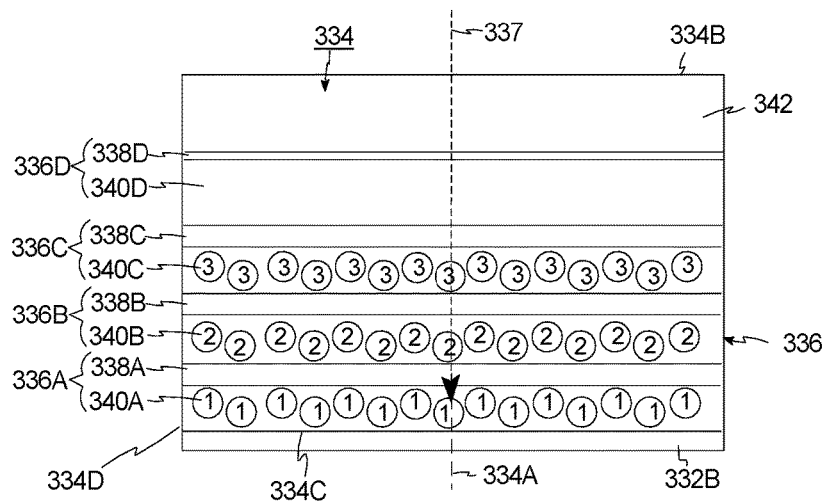
FIG. 3C is a simplified, side plan view of a pixel from the sensor assembly of FIG. 3A.

FIG. 3C is an enlarged simplified view of one, non-exclusive embodiment of one of the pixels 334 of the sensor assembly 316 of FIG. 3B. In this embodiment, the pixel 334 again includes a pixel top 334B, a pixel bottom 334C positioned on the common array substrate 332B, and four pixel sides 334D. It should be noted that the other pixels 334 of the sensor array 332 of FIG. 3B can have a similar design or be different in design from the pixel 334 illustrated in FIG. 3C.

In FIG. 3C, the pixel 334 includes one visible passband filter 342, and four, rectangular shaped pixel layers 336 that are stacked on each other along the pixel axis 334A. More specifically, in this embodiment, moving from the pixel bottom 334C to the pixel top 334B, the pixel 334 includes (i) a first pixel layer 336A that is stacked on top of the array substrate 332B; (ii) a second pixel layer 336B that is stacked directly on top of the first pixel layer 336A; (iii) a third pixel layer 336C that is stacked directly on top of the second pixel layer 336B; (iv) a fourth pixel layer 336D that is stacked directly on top of the third pixel layer 336C; and (v) one of the visible passband filters 342 stacked on top the fourth pixel layer 336D. However, it should be noted that any of these layers can be referred to the "first", "second", "third", or "fourth" pixel layer.

In this embodiment, each pixel layer 336 provides a separate signal that relates to the amount of light 337 (illustrated as a dashed arrow) they receive from different portions of the detection spectrum. In this embodiment, each pixel 334 provides four separate, simultaneous signals that can be used by the control system 22 (illustrated in FIG. 1) for generating one or more images 26 (illustrated in FIG. 1).

In FIG. 3C, (i) the first pixel layer 336A includes a first electrode 338A and a plurality of first quantum dots 340A that are designed to absorb light in a first range of wavelengths; (ii) the second pixel layer 336B includes a second electrode 338B and a plurality of second quantum dots 340B that are designed to absorb light in a second range of wavelengths; (iii) the third pixel layer 336C includes a third electrode 338C and a plurality of third quantum dots 340C that are designed to absorb light in a third range of wavelengths; and (iv) the fourth pixel layer 336D is a fourth electrode 338D and a visible light sensor 340D that absorbs light in the visible spectrum. In one embodiment, the visible light sensor 340D can includes a silicon detector. For example, silicon can transmit light from 900 nanometers to long-wavelength infrared. Further, as a non-exclusive example, the fourth electrode 338D can be a graphene layer.

The electrodes 338A-338C and the quantum dots 340A-340C can be similar to the corresponding components described above. In one embodiment, moving from the pixel top 334B to the pixel bottom 334C, the quantum dots 340A-340C are designed so that each subsequent pixel layer 336 absorbs lower energy (longer wavelengths). Further, the visible light sensor 340D can include silicon or a plurality of quantum dots that sense light in the visible light spectrum.

In one, non-exclusive embodiment, the control system 22 measures (i) a first voltage difference ($\Delta V_1$) between the first electrode 338A and the array substrate 332B to measure the first charge and generate a first signal that relates the amount of light within the first range of wavelengths that is present in the light beam 337 at this pixel 334; (ii) a second voltage difference ($\Delta V_2$) between the second electrode 338B and the first electrode 338A to measure the second charge and generate a second signal that relates the amount of light within the second range of wavelengths that is present in the light beam 337 at this pixel 334; (iii) a third voltage difference ($\Delta V_3$) between the third electrode 338C and the second electrode 338B to measure the third charge and generate a third signal that relates the amount of light within the third range of wavelengths that is present in the light beam 337 at this pixel 334; (iv) a fourth voltage difference ($\Delta V_4$) between the fourth electrode 338D and the third electrode 338C to measure the fourth charge and generate a fourth signal that relates the amount of light within the fourth range of wavelengths that is present in the light beam 337 at this pixel 334.

In this embodiment, the control system 22 receives four separate signals for each pixel 334, and these signals can be used to generate the desired image 26. Thus, the control system 22 receives a separate signal for each separate range of wavelengths of the detection spectrum for each pixel 334.

As a non-exclusive example, if the desired detection spectrum is the visible light to long-wavelength infrared spectrum, (i) the fourth range of wavelengths can include visible light (380-750 nanometers); (ii) the third range of wavelengths can include short wavelength infrared light (750 nanometers-3 microns); (iii) the second range of wavelengths can include mid-wavelength infrared light (3-8 microns); (iv) the first range of wavelengths can include long wavelength infrared light (8 microns-1 millimeter).

With this design, the fourth pixel layers 336D below the red filters 342A (illustrated in FIG. 3A) measure the red light; the fourth pixel layers 336D below the blue filters 342B (illustrated in FIG. 3B) measure the blue light; and the fourth pixel layers 336D below the green filters 342C (illustrated in FIG. 3B) measure the green light. As a result thereof, the control system 22 can generate a color image 26 that also includes infrared.

Alternatively, for example, the sensor assembly 316 can be designed without the visible light filter array 342. In this design, the image 26 would be grayscale. Still alternatively, each pixel 334 could be designed to include more than three or fewer than three infrared sensing pixel layers 336A-336C.

Figure 4A:
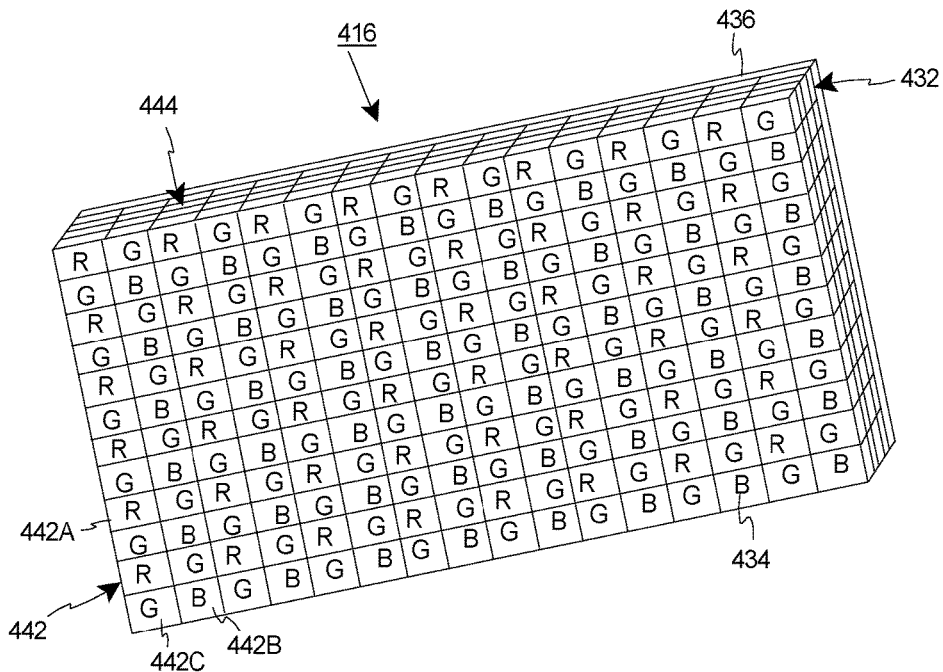
FIG. 4A is a simplified perspective view of yet another embodiment of a sensor assembly having features of the present invention.

FIG. 4A is a simplified perspective illustration of another embodiment of a sensor assembly 416 having features of the present invention. In this embodiment, the sensor assembly 416 includes a sensor array 432, a visible light filter array 442 positioned on top of the sensor array 432, and an infrared light filter array 444 positioned within the sensor array 432. In this embodiment, the sensor array 432 again includes a plurality of light-sensitive photosites 434 ("pixels") that are arranged in a rectangular array. The number of pixels 434, the design of each pixel 434, and the arrangement of the pixels 434 can be varied pursuant to the teachings provided herein. In the simplified example of FIG. 4A, the sensor array 432, the visible light filter array 442, and infrared light filter array 444 include only a twelve by sixteen, rectangular shaped array of one hundred and ninety two, pixels 434 for ease of illustration.

In this embodiment, each pixel 434 can include a plurality of stacked pixel layers 436 that allow for the detection and sensing of wavelengths of light ranging from visible light to long-wavelength infrared ("LWIR"). Further, for each pixel 434, the number of pixel layers 436 and the design of each pixel layer 436 can be customized to tune the sensor assembly 416 to detect and sense the desired wavelengths of interest.

In this embodiment, the visible light filter array 442 includes (i) a plurality of first, visible light passband filters 442A (denoted with a "R"), (ii) a plurality of second, visible light passband filters 442B (denoted with a "B"), and (iii) a plurality of third visible light passband filters 442C (denoted with a "G") that are similar to the corresponding components described above.

Figure 4B:
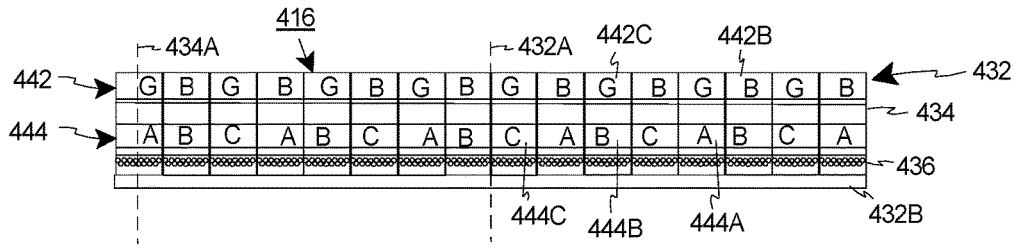
FIG. 4B is a simplified, side plan view of the sensor assembly of FIG. 4A.

FIG. 4B is a simplified side view of the sensor assembly 416 including the sensor array 432, the visible light filter array 442, and infrared light filter array 444 of FIG. 4A. In this embodiment, the sensor array 432 includes the array axis 432A, and each pixel 434 includes two pixel layers 436 that are positioned along a pixel axis 434A (only one pixel axis is shown) of each pixel 434. Moreover, in this non-exclusive embodiment, the pixels 434 are again stacked on top of the common array substrate 432B that supports the pixels 434. In one embodiment, the infrared light filter array 444 includes (i) a plurality of first, infrared light passband filters 444A (denoted with an "A") that transmit light in a first infrared light passband, and blocks light that is outside the first infrared light passband; (ii) a plurality of second, infrared light passband filters 444B (denoted with a "B") that transmit light in a second infrared light passband, and blocks light that is outside the second infrared light passband; and (iii) a plurality of third infrared light passband filters 444C (denoted with a "C") that transmit light in a third infrared light passband, and blocks light outside the third infrared passband. In one non-exclusive embodiment, (i) the first infrared light passband filter 444A transmits short wavelength infrared light, and blocks mid-wavelength and long-wavelength infrared light; (ii) the second infrared light passband filter 444B transmits mid-wavelength infrared, and blocks short-wavelength and long-wavelength infrared light; and (iii) the third infrared light passband filter 444C transmits long-wavelength infrared, and blocks short-wavelength and mid-wavelength infrared light.

It should be noted that the infrared light passband filters 444A, 444B, 444C can be arranged in any fashion or evenly distributed in an alternating fashion. Further, the infrared light filter array 444 can include more than three or fewer than three infrared light passband filters 444A, 444B, 444C.

It should be noted that the visible light filter array 442 is stacked on top of the sensor array 432, and the infrared light filter array 444 is positioned in between pixel layers 436. Further, as provided above, the visible light filter array 442 includes a separate filter 442A (illustrated in FIG. 4A), 442B, 442C, and the infrared light filter array 444 includes a separate filter 444A, 444B, 444C for each pixel 434. Thus, in this embodiment, each pixel 434 includes two pixel layers 436, one visible passband filter 442A, 442B, 442C, and one infrared light passband filters 444A, 444B, 444C.

Figure 4C:
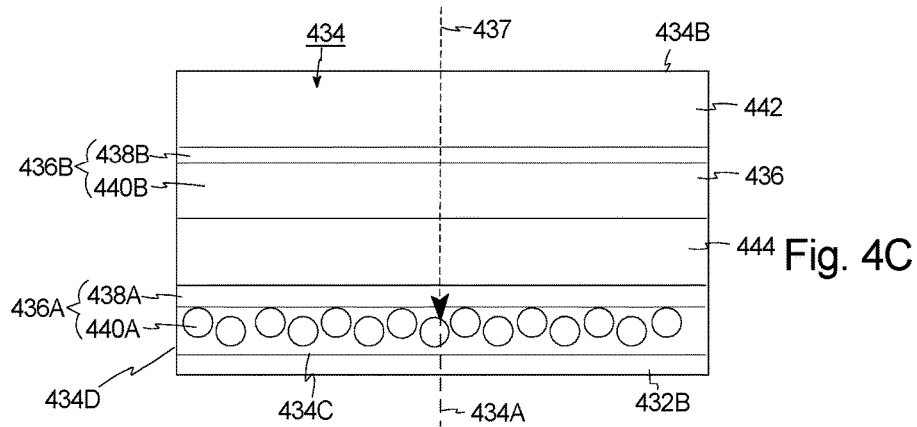
FIG. 4C is a simplified, side plan view of a pixel from the sensor assembly of FIG. 4A.

FIG. 4C is an enlarged simplified view of one, non-exclusive embodiment of one of the pixels 434 of the sensor assembly 416 of FIG. 4B. In this embodiment, the pixel 434 again includes a pixel top 434B, a pixel bottom 434C positioned on the common array substrate 432B, and four pixel sides 434D. It should be noted that the other pixels 434 of the sensor array 432 of FIG. 4B can have a similar design or be different in design from the pixel 434 illustrated in FIG. 4C.

In FIG. 4C, moving from the pixel bottom 434C to the pixel top 434B, the pixel 434 includes (i) a first pixel layer 436A that is stacked on top of the array substrate 432B; (ii) one of the infrared passband filters 444 stacked directly on top of the first pixel layer 436A; (iii) a second pixel layer 436B that is stacked directly on top of the infrared passband filter 444; and (iv) one of the visible passband filters 442 stacked on top the second pixel layer 436B.

In this embodiment, each pixel layer 436 provides a separate signal that relates to the amount of light 437 (illustrated as a dashed arrow) they receive from different portions of the detection spectrum. In this embodiment, each pixel 434 provides two separate, simultaneous signals that can be used by the control system 22 (illustrated in FIG. 1) for generating one or more images 26 (illustrated in FIG. 1).

In FIG. 4C, (i) the first pixel layer 436A includes a first electrode 438A and a plurality of first quantum dots 440A that are designed to absorb light in a first range of wavelengths (e.g. entire or a portion of the infrared light range); and (ii) the second pixel layer 436B includes a second electrode 438B and a visible light sensor 440B that absorbs light in the visible spectrum.

The electrodes 438A-438B and the quantum dots 440A can be similar to the corresponding components described above. In one embodiment, moving from the pixel top 434B to the pixel bottom 434C, the pixel layers 436A, 436B are designed so that each subsequent pixel layer 436 absorbs lower energy (longer wavelengths). Further, the visible light sensor 440B can include silicon or a plurality of quantum dots that sense light in the visible light spectrum.

In one, non-exclusive embodiment, the control system 22 measures (i) a first voltage difference ($\Delta V_1$) between the first electrode 438A and the array substrate 432B to measure a first charge and generate a first signal that relates the amount of light within the first range of wavelengths that is present in the light beam 437 at this pixel 434; and (ii) a second voltage difference ($\Delta V_2$) between the second electrode 438B and the first electrode 438A to measure a second charge and generate a second signal that relates the amount of light within the second range of wavelengths that is present in the light beam 437 at this pixel 434. Alternatively, or additionally, the current can be measured.

In this embodiment, the control system 22 receives two separate signals for each pixel 434, and these signals can be used to generate the desired image 26. Thus, the control system 22 receives a separate signal for each separate range of wavelengths of the detection spectrum for each pixel 434.

As a non-exclusive example, if the desired detection spectrum is the visible light to long-wavelength infrared spectrum, (i) the second range of wavelengths can include visible light (380-750 nanometers); and (ii) the first range of wavelengths can include infrared light (750 nanometers-1 millimeter).

With this design, the second pixel layers 436B below the red filters 442A (illustrated in FIG. 4A) measure the red light; the second pixel layers 436B below the blue filters 442B (illustrated in FIG. 4B) measure the blue light; and the second pixel layers 436B below the green filters 442C (illustrated in FIG. 4B) measure the green light. As a result thereof, the control system 22 can generate a color image 26 that also includes infrared.

Further, the first pixel layers 436A below the first infrared filter 444A (illustrated in FIG. 4B) measure the short-wavelength infrared light; the first pixel layers 436A below the second infrared filter 444B (illustrated in FIG. 4B) measure the mid-infrared light; and the first pixel layers 436A below the third infrared filter 444C (illustrated in FIG. 4B) measure the long-wavelength infrared light. As a result thereof, the control system 22 can independently detect these different wavelengths of infrared light.

Alternatively, for example, the sensor assembly 416 can be designed without the visible light filter array 442. In this design, the image 26 would be grayscale. Still alternatively, each pixel 434 could be designed without the infrared light filter array 442.

Figure 5A:
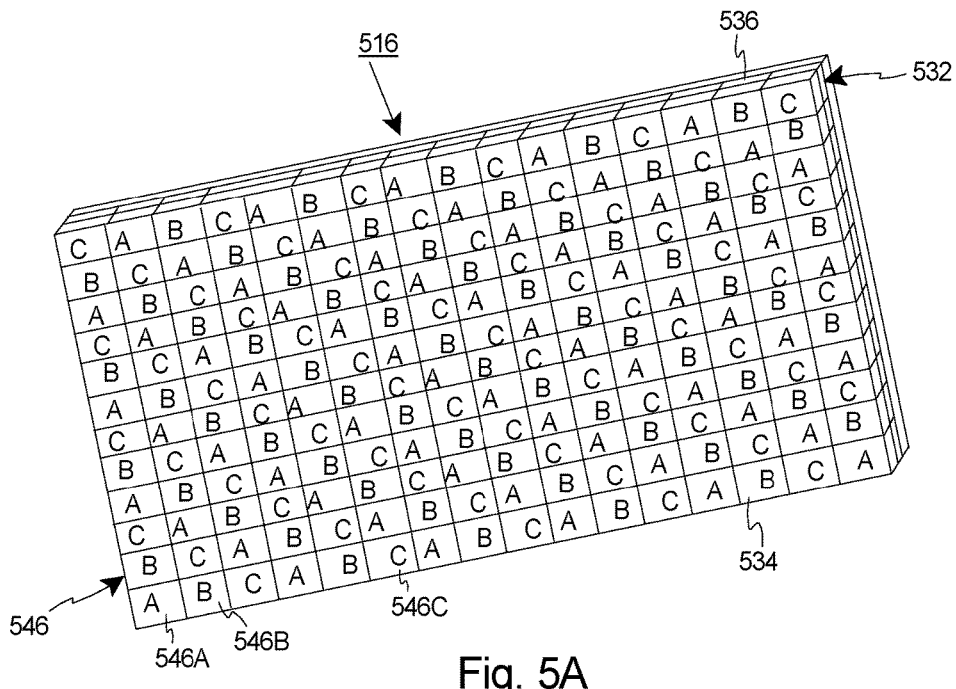
FIG. 5A is a simplified perspective view of still another embodiment of a sensor assembly having features of the present invention.

FIG. 5A is a simplified perspective illustration of still another embodiment of a sensor assembly 516 having features of the present invention. In this embodiment, the sensor assembly 516 includes a sensor array 532 and a filter array 546 positioned on top of the sensor array 532. In this embodiment, the sensor array 532 again includes a plurality of light-sensitive photosites 534 ("pixels") that are arranged in a rectangular array. The number of pixels 534, the design of each pixel 534, and the arrangement of the pixels 534 can be varied pursuant to the teachings provided herein.

In this embodiment, each pixel 534 can include one or more pixel layers 536 that allow for the detection and sensing of wavelengths of light ranging from ultraviolet to long-wavelength infrared ("LWIR"). Further, for each pixel 534, the design of each pixel layer 536 can be customized to tune the sensor assembly 516 to detect and sense the desired wavelengths of interest.

In one embodiment, the light filter array 546 includes (i) a plurality of first, light passband filters 546A (denoted with an "A") that transmit light in a first light passband, and blocks light that is outside the first light passband; (ii) a plurality of second, light passband filters 546B (denoted with a "B") that transmit light in a second light passband, and blocks light that is outside the second light passband; and (iii) a plurality of third light passband filters 546C (denoted with a "C") that transmit light in a third light passband, and blocks light outside the third passband. Alternatively, the light filter array 546 can be designed to include less than three or more than three alternative passband filters 546A, 546B, 546C.

In one non-exclusive embodiment, (i) the first light passband filter 546A transmits short wavelength infrared light, and blocks non-short wavelength infrared light (e.g. mid-wavelength and long-wavelength infrared light); (ii) the second light passband filter 546B transmits mid-wavelength infrared light, and blocks non-mid-wavelength infrared light (e.g. short-wavelength and long-wavelength infrared light); and (iii) the third light passband filter 546C transmits long-wavelength infrared light, and blocks non-long-wavelength light (e.g. short-wavelength and mid-wavelength infrared light).

In another, non-exclusive embodiment, (i) the first light passband filter 546A transmits red light, and blocks light that is not red; (ii) the second light passband filter 546B transmits blue light, and blocks light that is not blue; and (iii) the third light passband filter 546C transmits green light, and blocks light that is not green.

In still another, non-exclusive embodiment, (i) the first light passband filter 546A that transmits ultra-violet light, and blocks light that is not ultra-violet; (ii) the second light passband filter 546B that transmits visible light, and blocks non-visible light; and (iii) the third light passband filter 546C transmits infrared light, and blocks light that is not infrared.

It should be noted that in FIG. 5A, the passband filters 546A, 546B, 546C are arranged in an alternating fashion. In an alternative embodiment, passband filters 546A, 546B, 546C can be arranged in another fashion (e.g. somewhat similar to a Bayer filter or another arrangement).

Figure 5B:
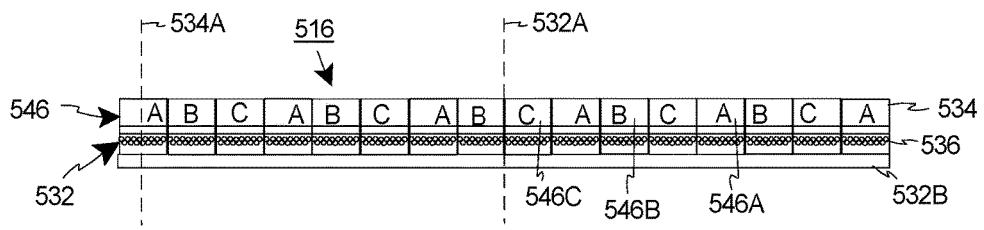
FIG. 5B is a simplified, side plan view of the sensor assembly of FIG. 5A.

FIG. 5B is a simplified side view of the sensor assembly 516 including the sensor array 532, and the light filter array 546 of FIG. 5A. In this embodiment, the sensor array 532 includes the array axis 532A, and each pixel 534 includes a single pixel layer 536 that is positioned along a pixel axis 534A of each pixel 534. Moreover, in this non-exclusive embodiment, the pixels 534 are again stacked on top of the common array substrate 532B that supports the pixels 534.

It should be noted that the light filter array 546 is stacked on top of the sensor array 532. Further, as provided above, the light filter array 546 includes a separate filter 546A, 546B, 546C for each pixel 534. Thus, in this embodiment, each pixel 534 includes one pixel layer 536 and one passband filter 546A, 546B, 546C that stacked along the pixel axis 534A.

Figure 5C:
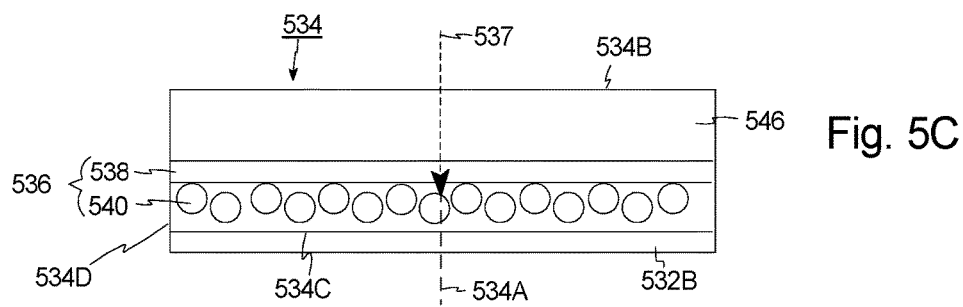
FIG. 5C is a simplified, side plan view of a pixel from the sensor assembly of FIG. 5A.

FIG. 5C is an enlarged simplified view of one, non-exclusive embodiment of one of the pixels 534 of the sensor assembly 516 of FIG. 5B. In this embodiment, the pixel 534 again includes a pixel top 534B, a pixel bottom 534C positioned on the common array substrate 532B, and four pixel sides 534D. It should be noted that the other pixels 534 of the sensor array 532 of FIG. 5B can have a similar design or be different in design from the pixel 534 illustrated in FIG. 5C.

In FIG. 5C, moving from the pixel bottom 534C to the pixel top 534B, the pixel 534 includes (i) a pixel layer 536 that is stacked on top of the array substrate 532B; and (ii) one of the passband filters 546 stacked directly on top of the pixel layer 536.

In this embodiment, the pixel layer 536 provides a separate signal that relates to the amount of light 537 (illustrated as a dashed arrow) they receive from different portions of the detection spectrum. In this embodiment, each pixel 534 provides a separate, signal that can be used by the control system 22 (illustrated in FIG. 1) for generating one or more images 26 (illustrated in FIG. 1).

In FIG. 5C, (i) the pixel layer 536 includes an electrode 538 and a plurality of quantum dots 540 that are designed to absorb light in a range of wavelengths (e.g. entire or a portion of the ultraviolet to infrared light range). The electrode 538 and the quantum dots 540 can be similar to the corresponding components described above. In one, non-exclusive embodiment, the control system 22 measures a voltage difference ($\Delta V$) between the electrode 538 and the array substrate 532B to measure a charge and generate a signal that relates the amount of light within the range of wavelengths that is present in the light beam 537 at this pixel 534. In this embodiment, the control system 22 receives a separate signal for each pixel 534 that can be used to generate the desired image 26.

With this design, (i) the pixel layer 536 that is below the first passband filter 546A (illustrated in FIG. 5B) measures the light that is within first light passband; (i) the pixel layer 536 that is below the second passband filter 546B (illustrated in FIG. 5B) measures the light that is within second light passband at that pixel 534; and (iii) the pixel layer 536 that is below the third passband filter 546C (illustrated in FIG. 5B) measures the light that is within third light passband. It should be noted that each pixel 534 will only measure and collect light from only one of these light passbands.

Figure 6:
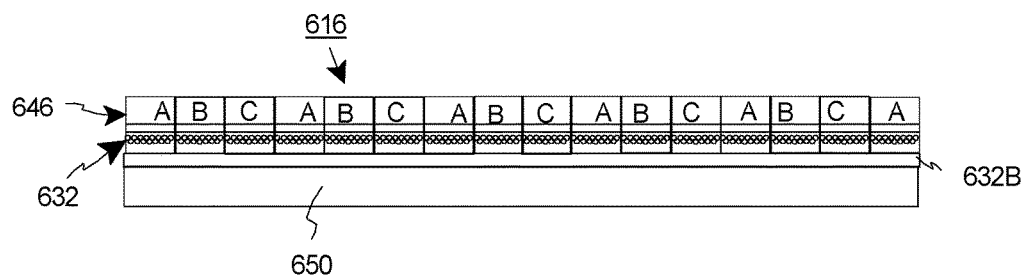
FIG. 6 is a simplified side plan view of yet another sensor assembly having features of the present invention.

In yet another alternative configuration, the sensor assembly could be cooled, (e.g. super-cooled). For example, FIG. 6 illustrates a sensor assembly 616 that can be super-cooled. In this embodiment, the sensor assembly 616 includes a filter array 646 and a sensor array 632 that are similar to the corresponding components described above and illustrated in FIGS. 5A-5C. However, in this embodiment the sensor assembly 616 also includes a cooling plate 650 that is positioned adjacent to the array substrate 632B. In one, non-exclusive embodiment, the cooling plate 650 is a thermoelectric cooler.

This configuration can significantly reduce inherent thermal noise and over-all signal to noise. If the Graphene layer electrode used is composed of $CaC_6$ graphene or other superconducting compound, and a sufficiently low enough temperature is achieved (the critical temperature for $CaC_6$ graphene is 11.5 degrees kelvin), then the graphene layer becomes super-conducting and represents zero impedance to electron flow increasing the performance of the sensor assembly 616 even further. This may be beneficial for longer wavelength infrared detection, or in scenarios requiring ultra-high sensitivity and low noise characteristics.

It should be noted that the sensor assemblies 16, 316, 416 illustrated in FIGS. 2A, 3A, 4A can also be modified to include cooling.

Figure 7:
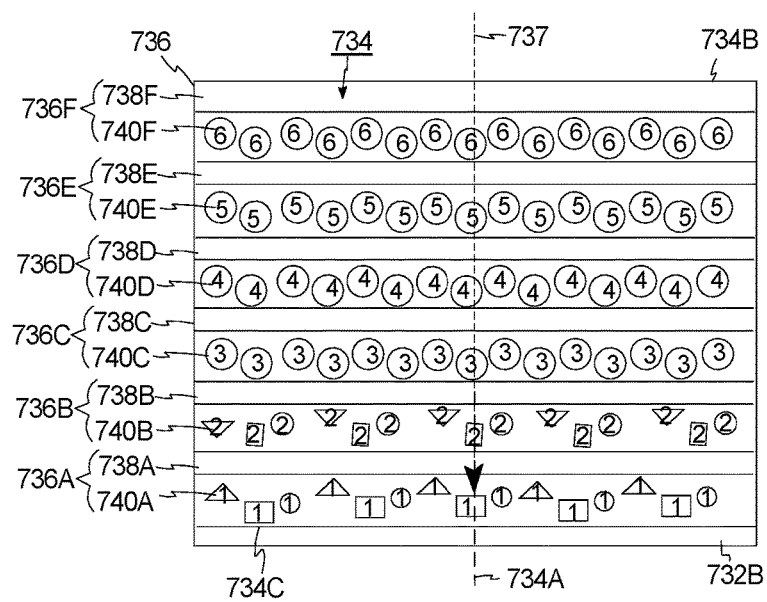
FIG. 7 is a simplified, side plan view of another embodiment of a pixel.

FIG. 7 is an enlarged simplified view of another non-exclusive embodiment of a pixel 734 that can be used in one of the sensor arrays 232 described above. In this embodiment, the pixel 734 is somewhat similar to the pixel 234 described above and illustrated in FIG. 2D. It should be noted that the other pixels 234 of the sensor array 232 of FIG. 2C can have a similar design or be different in design from the pixel 734 illustrated in FIG. 7.

In FIG. 7, the pixel 734 again includes six, rectangular shaped pixel layers 736 that are stacked on each other along the pixel axis 734A. In this embodiment, moving from the pixel bottom 734C to the pixel top 734B, the pixel 734 includes (i) a first pixel layer 736A that is stacked on top of the array substrate 732B; (ii) a second pixel layer 736B that is stacked directly on top of the first pixel layer 736A; (iii) a third pixel layer 736C that is stacked directly on top of the second pixel layer 736B; (iv) a fourth pixel layer 736D that is stacked directly on top of the third pixel layer 736C; (v) a fifth pixel layer 736E that is stacked directly on top of the fourth pixel layer 736D; and (vi) a sixth pixel layer 736F that is stacked directly on top of the fifth pixel layer 736E. In one embodiment, each pixel layer 736 again provides a separate signal that relates to the amount of light 737 (illustrated as a dashed arrow) they receive from different portions of the detection spectrum.

Further, in FIG. 7, (i) the first pixel layer 736A includes a first electrode 738A and a plurality of first quantum dots 740A that are electrically and physically connected to the first electrode 738A; (ii) the second pixel layer 736B includes a second electrode 738B and a plurality of second quantum dots 740B that are electrically and physically connected to the second electrode 738B; (iii) the third pixel layer 736C includes a third electrode 738C and a plurality of third quantum dots 740C that are electrically and physically connected to the third electrode 738C; (iv) the fourth pixel layer 736D includes a fourth electrode 738D and a plurality of fourth quantum dots 740D that are electrically and physically connected to the fourth electrode 738D; (v) the fifth pixel layer 736E includes a fifth electrode 738E and a plurality of fifth quantum dots 740E that are electrically and physically connected to the fifth electrode 738E; and (vi) the sixth pixel layer 736F includes a sixth electrode 738F and a plurality of sixth quantum dots 740F that are electrically and physically connected to the sixth electrode 738F.

In one embodiment, (i) the first quantum dots 740A are designed to absorb light in a first range of wavelengths; (ii) the second quantum dots 740B are designed to absorb light in a second range of wavelengths that is different from the first range of wavelengths; (iii) the third quantum dots 740C are designed to absorb light in a third range of wavelengths that is different from the first range of wavelengths and the second range of wavelengths; (iv) the fourth quantum dots 740D are designed to absorb light in a fourth range of wavelengths that is different from the first range of wavelengths, the second range of wavelengths, and the third range of wavelengths; (v) the fifth quantum dots 740E are designed to absorb light in a fifth range of wavelengths that is different from the first range of wavelengths, the second range of wavelengths, the third range of wavelengths, and the fourth range of wavelengths; and (vi) the sixth quantum dots 740F are designed to absorb light in a sixth range of wavelengths that is different from the first range of wavelengths, the second range of wavelengths, the third range of wavelengths, the fourth range of wavelengths, and the fifth range of wavelengths.

In this embodiment, the size, shape and/or properties of each of the quantum dots 740A-740F are different, and each range of wavelengths is different. In FIG. 7, the third through sixth pixel layers 736C-736F are somewhat similar to the corresponding components described above and illustrated in FIG. 2D. However, the first and second pixel layers 736A, 736B are slightly different. More specifically, in this embodiment, (i) the sixth quantum dots 740F of the sixth pixel layer 736F are all pretty similar in size, shape, and properties; (ii) the fifth quantum dots 740E of the fifth pixel layer 736E are all pretty similar in size, shape, and properties; (iii) the fourth quantum dots 740D of the fourth pixel layer 736D are all pretty similar in size, shape, and properties; and (iv) the third quantum dots 740C of the third pixel layer 736E are all pretty similar in size, shape, and properties.

Alternatively, (i) the second quantum dots 740B vary in size, shape, and/or properties across the second pixel layer 736B; and (ii) the first quantum dots 740A vary in size, shape, and/or properties across the first pixel layer 736A. Stated in another fashion, in this embodiment, (i) the first pixel layer 736A is a blended layer that includes first quantum dots 740A that vary in size, shape, and/or properties; and (ii) the second pixel layer 736B is a blended layer that includes second quantum dots 740B that vary in size, shape, and/or properties. In a blended pixel layer 736A, 736B, different sizes, shapes and/or compositions of quantum dots 740A, 740B are used in the same pixel layer 736A, 736B. As provided herein, (i) the blending of the first quantum dots 740A allows for the customization of the response (e.g. the absorption profile) of the first pixel layer 736A; and (ii) the blending of the second quantum dots 740B allows for the customization of the response (e.g. the absorption profile) of the second pixel layer 736B.

As provided herein, the physical size and/or composition of the blend of quantum dots 740A, 740B can be selected to tune the response of that pixel layer 736A, 736B to get an extended wavelength range, a flatter response curve, and/or a customized response curve. The amount of variance in the quantum dots 740A, 740B for a particular pixel layer 736A, 736B can be selected to achieve the desired response for that layer 736A, 736B. In alternative, non-exclusive embodiments, for a given pixel layer 736A, 736B, the size, shape, and/or properties of the quantum dots 740A, 740B can be varied to achieve an absorption profile variation of at least approximately 10, 15, 20, 25, or 30 percent across the respective pixel layer 736A, 736B. In more specific, alternative, non-exclusive embodiments, for a given pixel layer 736A, 736B, the size of the quantum dots 740A, 740B can be varied at least approximately 10, 15, 20, 25, or 30 percent across the respective pixel layer 736A, 736B.

It should be noted that one or more of the other pixel layers 736C-736F can be a blended layer, instead of or in addition to the first and second pixel layers 736A, 736B.

If a blend of quantum dots 740A, 740B is utilized, it is not possible to distinguish which electron came from which quantum dot 740A, 740B, so there is no wavelength differentiation for that pixel layer 736A, 736B.

Figure 8A:
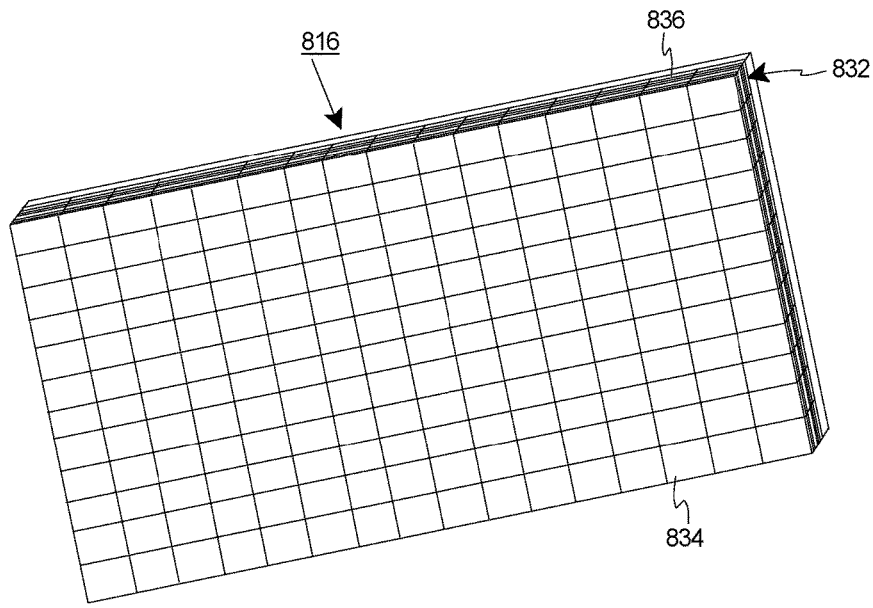
FIG. 8A is a simplified perspective view of yet another embodiment of a sensor assembly having features of the present invention.

FIG. 8A is a simplified perspective illustration of still another embodiment of a sensor assembly 816 having features of the present invention. In this embodiment, the sensor assembly 816 includes a sensor array 832 that includes a plurality of light-sensitive photosites 834 ("pixels") that are arranged in a rectangular array. The number of pixels 834, the design of each pixel 834, and the arrangement of the pixels 834 can be varied pursuant to the teachings provided herein.

In one non-exclusive embodiment, each pixel 834 can include one or more pixel layers 836 that allow for the detection and sensing of wavelengths of light in the ultraviolet range. Further, for each pixel 834, the design of each pixel layer 836 can be customized to tune the sensor assembly 816 to detect and sense the desired wavelengths of interest.

Figure 8B:
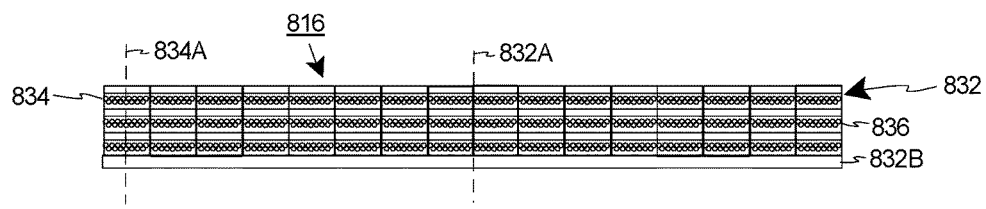
FIG. 8B is a simplified, side plan view of the sensor assembly of FIG. 8A.

FIG. 8B is a simplified side view of the sensor assembly 816 including the sensor array 832 of FIG. 8A. In this embodiment, the sensor array 832 includes the array axis 832A, and each pixel 834 includes three pixel layers 836 that are positioned along a pixel axis 834A of each pixel 834. Moreover, in this non-exclusive embodiment, the pixels 834 are again stacked on top of the common array substrate 832B that supports the pixels 834.

Figure 8C:
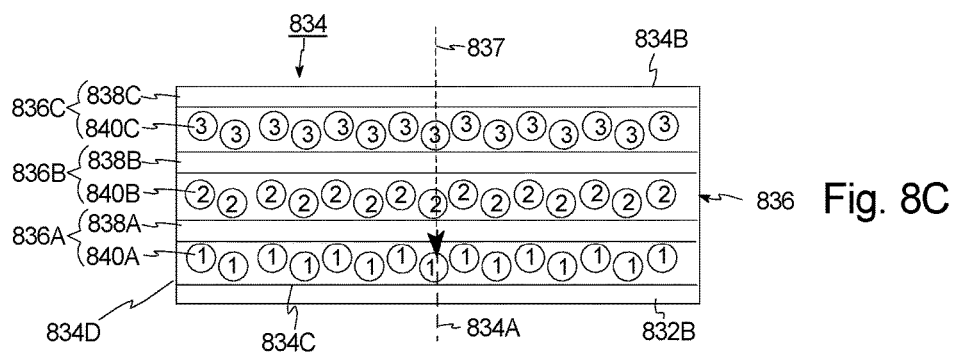
FIG. 8C is a simplified, side plan view of a pixel from the sensor assembly of FIG. 8A.

FIG. 8C is an enlarged simplified view of one, non-exclusive embodiment of one of the pixels 834 of the sensor assembly 816 of FIG. 8B. In this embodiment, the pixel 834 again includes a pixel top 834B, a pixel bottom 834C positioned on the common array substrate 832B, and four pixel sides 834D. It should be noted that the other pixels 834 of the sensor array 832 of FIG. 8B can have a similar design or be different in design from the pixel 834 illustrated in FIG. 8C.

In FIG. 8C, the pixel 834 includes three, rectangular shaped pixel layers 836 that are stacked on each other along the pixel axis 834A. In this embodiment, moving from the pixel bottom 834C to the pixel top 834B, the pixel 834 includes (i) a first pixel layer 836A that is stacked on top of the array substrate 832B; (ii) a second pixel layer 836B that is stacked directly on top of the first pixel layer 836A; and (iii) a third pixel layer 836C that is stacked directly on top of the second pixel layer 836B. In one embodiment, each pixel layer 836 again provides a separate signal that relates to the amount of light 837 (illustrated as a dashed arrow) they receive from different portions of the detection spectrum. Thus, each pixel 834 provides three separate, signals that can be used by the control system 22 (illustrated in FIG. 1) for generating one or more images 26 (illustrated in FIG. 1).

In FIG. 8C, (i) the first pixel layer 836A includes a first electrode 838A and a plurality of first quantum dots 840A that are electrically and physically connected to the first electrode 838A; (ii) the second pixel layer 836B includes a second electrode 838B and a plurality of second quantum dots 840B that are electrically and physically connected to the second electrode 838B; and (iii) the third pixel layer 836C includes a third electrode 838C and a plurality of third quantum dots 840C that are electrically and physically connected to the third electrode 838C.

In one embodiment, (i) the first quantum dots 840A are designed to absorb light in a first range of wavelengths; (ii) the second quantum dots 840B are designed to absorb light in a second range of wavelengths that is different from the first range of wavelengths; and (iii) the third quantum dots 840C are designed to absorb light in a third range of wavelengths that is different from the first range of wavelengths and the second range of wavelengths. In this embodiment, the size, shape and/or properties of each of the quantum dots 840A-840C are different, and each range of wavelengths is different.

With this design, in one embodiment, (i) the first pixel layer 836A can absorb and measure UVC light (e.g. 290-100 nanometers); (ii) the second pixel layer 836B can absorb and measure the UVB light (e.g. 320-290 nanometers); and (iii) the third pixel layer 836C can absorb and measure the UVA light (e.g. 400-320 nanometers). In this embodiment, the sensor assembly 816 is an ultraviolet detector.

While the particular assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A detector that detects light, the detector comprising: a sensor array that includes a plurality of pixels, each pixel including a first pixel layer, and a second pixel layer stacked on top of the first pixel layer; wherein the first pixel layer includes a first electrode and a plurality of first quantum dots that are electrically connected to the first electrode, the first quantum dots being designed to absorb light in a first range of wavelengths; wherein the second pixel layer includes a second electrode and a plurality of second quantum dots that are electrically connected to the second electrode, the second quantum dots being designed to absorb light in a second range of wavelengths that is different from the first range of wavelengths; wherein the second range of wavelengths has higher energy than the first range of wavelengths; wherein each electrode is made of a fast conductor material; and wherein one of the first electrode and the second electrode is positioned between the plurality of first quantum dots and the plurality of second quantum dots.

2. The detector of claim 1 wherein, for each pixel, the first pixel layer converts light that is in the first range of wavelengths into a first signal, and the second pixel layer converts light that is in the second range of wavelengths into a second signal.

3. The detector of claim 2 further comprising a control system that receives the signals from each pixel and creates an image.

4. The detector of claim 1 wherein the first range of wavelengths is in the infrared range, and the second range of wavelengths is in the infrared range.

5. The detector of claim 1 wherein the first range of wavelengths is in the infrared range, and the second range of wavelengths is in the visible range.

6. The detector of claim 1 wherein each pixel includes a third pixel layer that is stacked on top of the second pixel layer, the third pixel layer including a silicon that absorbs light in the visible range.

7. The detector of claim 6 further comprising a visible light filter array that is positioned on top of the third pixel layer, the visible light filter array including a visible light filter for each of the pixels of the sensor array.

8. The detector of claim 1 wherein each pixel includes a third pixel layer that is stacked on top of the second pixel layer, the third pixel layer including a third electrode and a plurality of third quantum dots that are electrically connected to the third electrode, the third quantum dots being designed to absorb light in a third range of wavelengths that is different from the first range of wavelengths and the second range of wavelengths; and wherein the third range of wavelengths has higher energy than the second range of wavelengths.

9. The detector of claim 8 wherein the first range of wavelengths is in the infrared range, the second range of wavelengths is in the infrared range, and the third range of wavelengths is in the infrared range.

10. The detector of claim 8 wherein each pixel includes a fourth pixel layer that is stacked on top of the third pixel layer, the fourth pixel layer including a fourth electrode and a plurality of fourth quantum dots that are electrically connected to the fourth electrode, the fourth quantum dots being designed to absorb light in a fourth range of wavelengths that is different from the first range of wavelengths, the second range of wavelengths, and the third range of wavelengths; and wherein the fourth range of wavelengths has higher energy than the third range of wavelengths.

11. The detector of claim 10 wherein each pixel includes a fifth pixel layer that is stacked on top of the fourth pixel layer, the fifth pixel layer including a fifth electrode and a plurality of fifth quantum dots that are electrically connected to the fifth electrode, the fifth quantum dots being designed to absorb light in a fifth range of wavelengths that is different from the first range of wavelengths, the second range of wavelengths, the third range of wavelengths, and the fourth range of wavelengths; and wherein the fifth range of wavelengths has higher energy than the fourth range of wavelengths.

12. The detector of claim 1 wherein at least one of the size, shape, and properties of the first quantum dots varies significantly across the first pixel layer to customize the response of the first pixel layer.

13. The detector of claim 1 wherein at least one of the size, shape, and properties of the second quantum dots varies significantly across the second pixel layer to customize the response of the second pixel layer.

14. The detector of claim 1 wherein the light is from an area of interest and the area of interest includes a medical sample.

15. A medical apparatus comprising a detector according to claim 1.

16. A detector that detects light, the detector comprising:
a sensor array that includes a plurality of pixels, each pixel including a first pixel layer, and a second pixel layer stacked on top of the first pixel layer; wherein the first pixel layer includes a first electrode and a plurality of first quantum dots that are electrically connected to the first electrode, the first quantum dots being designed to absorb light in a first range of wavelengths; wherein the second pixel layer includes a second electrode and silicon that absorbs light in a second range of wavelengths that is different from the first range of wavelengths; wherein the second range of wavelengths have a higher energy than the first range of wavelengths; wherein the first electrode is made of a fast conductor material; and wherein one of the first electrode and the second electrode is positioned between the plurality of first quantum dots and the silicon; and
a visible light filter array that is positioned on top of the sensor array, the visible light filter array including a separate visible light filter for each of the pixels of the sensor array, wherein each visible light filter bandpasses one of the visible colors and transmits light outside of the visible range.

17. The detector of claim 16 wherein, for each pixel, the first pixel layer converts light that is in the first range of wavelengths into a first signal, and the second pixel layer converts light that is in the second range of wavelengths into a second signal.

18. The detector of claim 17 further comprising a control system that receives the signals from each pixel and creates an image.

19. The detector of claim 16 wherein the first range of wavelengths is in the infrared range, and the second range of wavelengths is in the visible range.

20. The detector of claim 16 wherein each pixel includes a third pixel layer that is stacked below the first pixel layer, the third pixel layer including a third electrode and a plurality of third quantum dots that are electrically connected to the third electrode, the third quantum dots being designed to absorb light in a third range of wavelengths that is different from the first range of wavelengths, and the second range of wavelengths; and wherein the third range of wavelengths have lower energy than the first range of wavelengths.

21. The detector of claim 20 wherein each pixel includes a fourth pixel layer that is stacked below the third pixel layer, the fourth pixel layer including a fourth electrode and a plurality of fourth quantum dots that are electrically connected to the fourth electrode, the fourth quantum dots being designed to absorb light in a fourth range of wavelengths that is different from the first range of wavelengths, the second range of wavelengths, and the third range of wavelengths; and wherein the fourth range of wavelengths have lower energy than the third range of wavelengths.

22. A medical apparatus comprising a detector according to claim 16.

* * * * *